United States Patent
Zebedee et al.

(10) Patent No.: US 7,145,545 B2
(45) Date of Patent: Dec. 5, 2006

(54) SHIFT REGISTER

(75) Inventors: Patrick A. Zebedee, Oxford (GB); Harry Garth Walton, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 523 days.

(21) Appl. No.: 10/760,576

(22) Filed: Jan. 20, 2004

(65) Prior Publication Data
US 2004/0150610 A1    Aug. 5, 2004

(30) Foreign Application Priority Data
Jan. 25, 2003  (GB)  ................................ 0301789.4

(51) Int. Cl.
    *G09G 3/36*  (2006.01)
(52) U.S. Cl. ............................ 345/100; 377/81; 377/64
(58) Field of Classification Search .................. 345/99, 345/100, 208; 377/64, 78, 81
    See application file for complete search history.

(56) References Cited

U.S. PATENT DOCUMENTS

| | | | | |
|---|---|---|---|---|
| 4,799,057 A | * | 1/1989 | Takeda et al. | ............... 345/103 |
| 5,162,786 A | * | 11/1992 | Fukuda | ........................ 345/100 |
| 5,270,696 A | * | 12/1993 | Shin et al. | ................... 345/204 |
| 5,793,363 A | * | 8/1998 | Takuwa | ....................... 345/205 |
| 5,859,630 A | | 1/1999 | Huq | |
| 6,014,123 A | * | 1/2000 | Jung | ........................... 345/99 |
| 7,038,653 B1 | * | 5/2006 | Moon | ......................... 345/100 |
| 2002/0149318 A1 | | 10/2002 | Jeon et al. | |

FOREIGN PATENT DOCUMENTS

EP        0 631 289 A       12/1994

OTHER PUBLICATIONS

European Search Report corresponding to Application 04100244.5, dated May 27, 2004.

* cited by examiner

*Primary Examiner*—Kent Chang
(74) *Attorney, Agent, or Firm*—Renner, Otto, Boisselle & Sklar, LLP

(57) ABSTRACT

A shift register is provided, for example, for use in scan and data line drivers for an active matrix liquid crystal display. The shift register comprises X stages, where X is an integer greater than 3. A clock signal generator supplies Y-phase clock signals, where Y is greater than 2. Each of the stages comprises a flip-flop and logic circuit and receives a set enable signal from the immediately preceding stage output. Each stage is set by the leading edge of one of the clock phases in the pressure of the set enable signal and is reset by the trailing edge of the clock phase. In order to provide bi-directional operation, each intermediate stage also receives set enable signals from the immediately succeeding stage output. The clock signal generator supplies clock pulses in a first order for shift register operation in the forward direction and in the reverse order for shift register operation in the reverse direction.

29 Claims, 24 Drawing Sheets

FIG 2
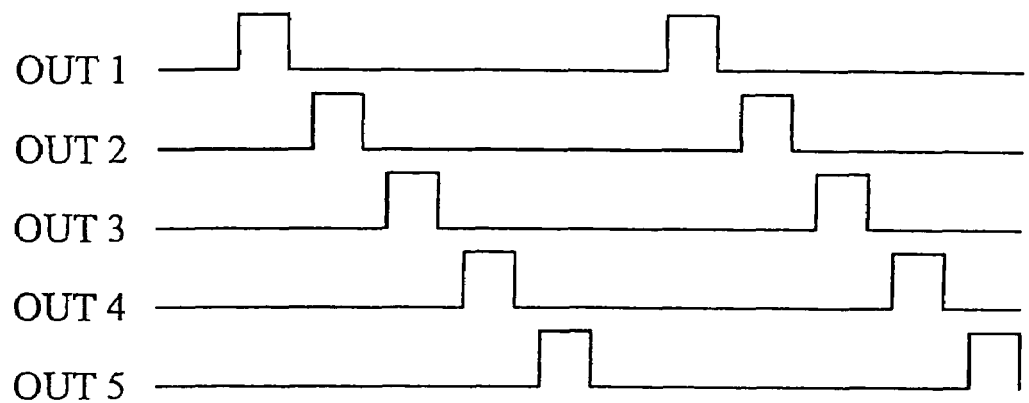
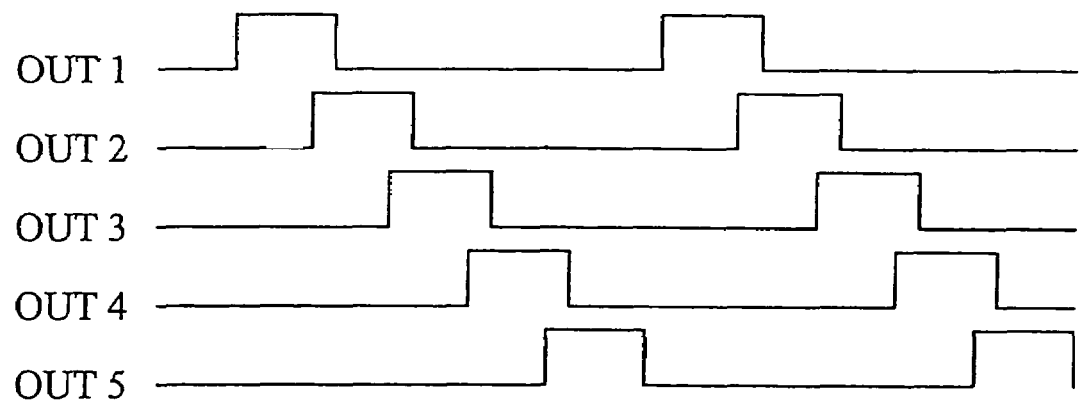
FIG 3

SHIFT REGISTER

This Nonprovisional application claims priority under 35 U.S.C. § 119(a) on Patent Application No.0301789.4 filed in Great Britain on 25 Jan. 2003, the entire contents of which are hereby incorporated by reference.

TECHNICAL FIELD

The present invention relates to a shift register. Such a register may, for example, be used in drive circuits for display devices to generate row and/or column select signals in active matrix displays. The present invention also relates to a driver for an active matrix device including such a register, an active matrix device including such a driver, and a display such as a liquid crystal display.

BACKGROUND

FIG. 1 of the accompanying drawings illustrates a typical active matrix display, for example of the liquid crystal type, comprising an active matrix 1 of N rows and M columns of picture elements (pixels). The columns are connected to M column electrodes which are connected to a data line driver 2 including an M-phase clock generator. The rows are connected to N row electrodes which are connected to a scan line driver 3 including an N-phase clock generator. In a typical display of this type, the M-phase clock generator is required to produce clock pulses at the data rate so as to sample incoming data for refreshing the active matrix 1 a row at a time. The N-phase clock generator is required to produce pulses at a scan rate so as to drive the scan lines one at a time for refreshing the active matrix 1 row by row.

Normal operation of a display of this type is such that the data are sampled to the data lines from left to right and the scan lines are driven from the top to the bottom of the active matrix 1. It is desirable to reduce or minimise the area occupied by the drivers 2 and 3. For example, when these drivers are integrated on the display substrate of a panel display, this allows a smaller bezel size to be used for the panel. Alternatively or additionally, this allows the integration of additional circuits without having to increase the panel size.

In some applications, it is desirable to be able to reverse the order of data and/or scan pulses such that the data are sampled to the data lines from right to left and/or such that the scan lines are driven from the bottom to the top of the active matrix 1. For example, this allows an image to be inverted, reflected or rotated without the need for extra memory in a data buffer supplying image data to the display and without the risk of image distortion. A common application of such an arrangement is to allow rotation of a display panel after manufacture to give a better fit in a host device.

A known type of multi-phase clock generator suitable for use in the drivers 2 and 3 of FIG. 1 comprises a shift register in the form of cascaded D-type flip-flops. The shift register is controlled by a clock so as to pass a single stored logic state along the chain of flip-flops. For example, FIG. 2 illustrates an example of the waveforms appearing at five outputs OUT1 to OUT5 of such a shift register. The five phase clock pulses appear in sequence on the outputs and do not overlap with each other. FIG. 3 of the accompanying drawings illustrates an alternative arrangement in which there is an overlap between consecutive pairs of clock pulses.

FIG. 4 of the accompanying drawing illustrates another type of shift register suitable for such an application and disclosed in GB2 345 207. In this simplified example, the shift register comprises five stages with each stage comprising a reset-set flip-flop (11–15) and a gate circuit (16–20), which receives complementary clock pulses CK and CKB. Each gate circuit has complementary inputs G and GB for receiving complementary outputs Q and QB from the flip-flop (RSFF) of the same stage and has complementary clock inputs CK and CKB. In the first, third and fifth stages, the gate clock inputs CK and CKB receive the clock signals CK and CKB, respectively, whereas, in the second and fourth stages, the clock inputs CK and CKB receive the clock signals CKB and CK, respectively.

In the intermediate stages of the shift register, the output O of the gate circuit comprises the output of the shift register and is also supplied to the re-set input R of the flip-flop of the preceding stage and to the set input S of the flip-flop of the succeeding stage. When enabled, the gate circuits 16, 18, 20 of the first, third and fifth stages supply a high state to their outputs O in response to a rising edge of the clock signal CK whereas the gate circuits 17 and 19 of the second and fourth stages respond to a falling edge of the clock signal CK.

During operation, for example when the flip-flop 12 of the second stage is set, its direct or non-inverting output Q is at a logic high level whereas its inverted or complementary output QB is at a logic low level so that the gate circuit 17 is enabled. In response to the arrival of the next falling edge of the clock signal CK the gate circuit 2 passes a high state to its output (O), which sets the flip-flop 13 and re-sets the flip-flop 11. The flip-flop 13 enables the gate circuit 18 which in turn sets the flip-flop 14 and re-sets the flip-flop 12 at the next rising edge of the clock signal CK.

The output signals produced by the shift register shown in FIG. 4 form a multi-phase clock with overlapping between consecutive output pulses. Depending on the application of the shift register, this overlapping may be exploited or removed.

A shift register of this type may be made bi-directional by controlling the direction of passage of the set and re-set signals, for example using transmission gates. However, this requires extra transistors and an up/down control line extending along the length of the shift register.

U.S. Pat. No. 5,410,583, U.S. Pat. No. 6,339,631 and U.S. Pat. No. 6,345,085 disclose an alternative arrangement in which an input multi-phase clock signal is supplied to a shift register arrangement with each stage passing one of the clock signals to its output. Each stage is enabled by the output of the preceding stage and is disabled by another of the clocks. Such arrangements are relatively compact but rely on nMOS pass transistors which, depending on the integration technology used, may have to be replaced with complementary transmission gates, thus increasing the size of such a shift register. No technique for providing bi-directional operation is disclosed.

U.S. Pat. No. 5,859,630 discloses a similar type of arrangement which is capable of bi-directional operation. The order in which clock pulses appear on the multi-phase clock inputs determines the shifting direction of the shift register. Although this technique does not require transmission gates for controlling the direction of shifting, each stage is more complex in that it requires two parallel control circuits controlling a single transistor to pass a signal. Also, each stage is required to be connected to the preceding two stages and the succeeding two stages so that extra connections are required.

The term "reset-over-set flip-flop circuit" as used herein is defined to mean any circuit which operates as a flip-flop in which resetting has priority over setting. Thus, when an active reset signal is present at a reset input, the flip-flop is or remains reset irrespective of the state of a signal at a set input. When an active setting signal is received at the set input, the flip-flop is only set in the absence of an active reset signal at the reset input (which is equivalent to an inactive reset signal at the reset input).

SUMMARY

According to a first aspect of the invention, there is provided a shift register comprising X stages (31–35), where X is an integer greater than three, and Y clock inputs (CK1–CK3), where Y is an integer greater than two, characterised in that each xth stage (32–35) comprises a flip-flop and logic circuit (36–50) arranged to receive a set enable signal from an output (Q, QB) of the (x−1)th stages (31–34), for each x such that $1<x\leq X$, and in that each (nY+y)th stage (31–35) is arranged to be set in response to a leading edge or a first level of a clock signal at the y th clock input (CK1–CK3) in the presence of the set enable signal and to be reset in response to a trailing edge or a second level of the clock signal at the y th clock input (CK1–CK2) for each y such that $O<y\leq Y$ and where n is a non-negative integer.

The first stage may be arranged to receive a start pulse from a start pulse input.

Each flip-flop and logic circuit may comprise a reset-over-set flip-flop circuit as defined hereinbefore. The reset-over-set flip-flop circuit may comprise a reset-set flip-flop and, an AND gate having an output connected to a set input of the flip-flop, a first input connected to the yth clock input and a second input connected to output of the (x−1)th stage.

The reset-over-set flip-flop circuit may have a complementary reset input connected to the yth clock input.

Each of the stages may comprise a level shifter for shifting the level of the reset signal.

The register may comprise a clock signal generator having Y multi-phase outputs connected to the Y clock inputs, respectfully. The clock generator may be arranged to supply multi-phase clock signals with the clock signals of pairs of adjacent phases overlapping each other. The clock signals of non-adjacent phases may be non-overlapping.

Each xth stage may be arranged to receive a set enable signal from an output of the (x+1)th stage. The Xth stage may be arranged to receive a start pulse from the start pulse input. The reset-over-set flip-flop circuit may comprise an OR gate having an output connected to the second input of the AND gate and inputs connected to the outputs of the (x−1)th and (x+1)th stages.

The clock signal generator may be controllable to supply clock pulses in sequence to the first to Yth clock inputs, respectively, or to the Yth to first clock inputs, respectively.

The clock signal generator may be controllable to supply inactive clock signals simultaneously to the clock inputs.

The clock signal generator may be controllable to supply active clock signals simultaneously to the clock inputs.

The register may comprise an arrangement for converting overlapping output pulses from the stages to non-overlapping pulses. The arrangement may comprise; a pulse generator for producing timing pulses each of which has a rising edge after the rising edge of a respective output signal of the stages and a falling edge before the falling edge of the respective output signal; and X logic circuits, each xth of which is arranged to perform a logical AND operation on the output signal of the xth stage and the timing pulses. The rising edge of each timing pulse may occur after the falling edge of the output signal preceding the respective output signal and the falling edge of each timing pulse may occur before the rising edge of the output signal following the respective output signal.

As an alternative, the arrangement may comprise a plurality of logic circuits, each xth of which is arranged to perform a logical AND operation on a direct output of the xth stage and inverted outputs of the (x−1)th and (x+1)th stages. As a further alternative, the arrangement may comprise a plurality of logic circuits, each xth of which is arranged to perform a logical AND operation on a direct output of the xth stage and an inverted output of the (x−1) th or (x+1)th stage.

The register may comprise an arrangement for converting output pulses from the stages to groups of simultaneous pulses. The arrangement may comprise: a pulse generator for generating timing pulses, each of which overlaps with the output pulses of a respective group of the stages; and X logic circuits, each xth of which is arranged to perform a logical AND operation on the output pulse of the xth stage and the timing pulses. The rising edge of each timing pulse may occur after the rising edges of all of the output signals of the respective group and the falling edge of each timing pulse may occur before the falling edges of all of the output signals of the respective group.

Y may be equal to 3.

Each of the clock inputs may be a complementary input for receiving complementary clock signals.

The register may comprise a CMOS integrated circuit.

According to a second aspect of the invention, there is provided a driver for an active matrix device, comprising a register according to the first aspect of the invention.

According to a third aspect of the invention, there is provided an active matrix device comprising at least one driver according to the second aspect of the invention.

The device may comprise a liquid crystal display.

It is thus possible to provide a shift register of relatively compact size, for example requiring less integrated circuit area than for known shift registers. In bi-directional embodiments, there is no need for multiplexers to control signal direction and hence no need for connections to control such multiplexers. Each flip-flop circuit is required to supply one output to one or each of its neighbouring stages only. Further, it is not necessary to duplicate large circuit blocks in order to provide bi-directional shifting.

Depending on the number of stages of the shift register, it may not be necessary to control which end is connected to receive a start pulse. Provided the first and last stages are connected to different clock inputs, both stages may receive the start pulse and correct operation in either direction of shifting is achieved. If the first and last stages are connected to the same clock input, the start pulse may be switched between them depending on the shifting direction or a dummy stage may be added to either or both ends of the shift register.

In embodiments where it is desirable to control overlapping of shift register output pulses, this may be achieved by adjusting the clock signals without the need for extra logic circuitry in the register itself. Similar techniques may also be used to control the resolution of a display when the shift register is used in one or more driver circuits of a display. In many embodiments, no asynchronous reset arrangement is necessary as this may be achieved by supplying the appropriate clock signals.

BRIEF DESCRIPTION OF THE DRAWINGS

FIGS. 2 and 3 are timing diagrams illustrating output signals of a known type of shift register;

Like reference numerals refer to like parts throughout the drawings.

DETAILED DESCRIPTION

A standard RS flip-flop with active high reset R and set S inputs operates in accordance with the following truth table:

| R | S | $Q_n$ |
|---|---|---|
| 0 | 0 | $Q_{n-1}$ |
| 0 | 1 | 1 |
| 1 | 0 | 0 |
| 1 | 1 | X | where X is an undefined or disallowed state, O is the logic low level, 1 is the logic high level, $Q_n$ is the output state, and $Q_{n-1}$ is the previous output state.

A reset-over-set flip-flop with active high reset and set inputs operates in accordance with the following truth table:

| R | S | $Q_n$ |
|---|---|---|
| 0 | 0 | $Q_{n-1}$ |
| 0 | 1 | 1 |
| 1 | 0 | 0 |
| 1 | 1 | 0 |

The embodiments disclosed herein make use of an active low reset active high set reset-over-set flip-flop and such circuits operate in accordance with the following truth table:

| RB | S | $Q_n$ |
|---|---|---|
| 0 | 0 | 0 |
| 0 | 1 | 0 |
| 1 | 0 | $Q_{n-1}$ |
| 1 | 1 | 1 |

Reset-over-set flip-flops may be embodied in many different ways and various examples are disclosed herein.

Figure 5:
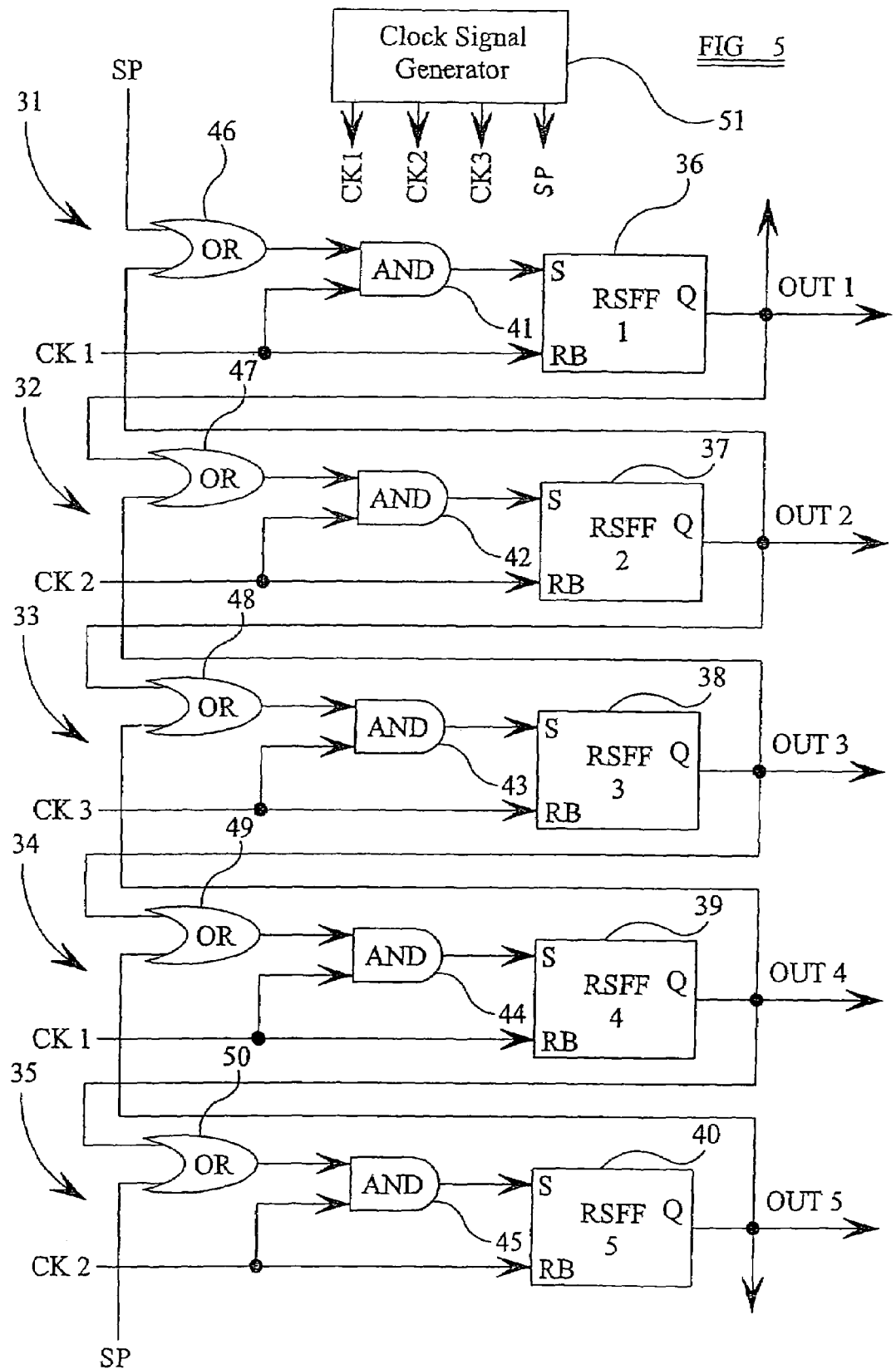
FIG. 5 is a block schematic diagram of a shift register constituting an embodiment of the invention.

For the purposes of illustration and without any loss of generality, FIG. 5 illustrates a e stage shift register controlled by a three phase clock. The first to fifth stages 31 to 35, respectfully, are in the form of reset-over-set flip-flops and comprise reset-set flip-flops (RSFF) 36 to 40, respectively, AND gates 41 to 45, respectively, OR gates 46 to 50, respectively, and a clock signal generator 51. The shift register has three clock inputs CK1, CK2 and CK3 connected to corresponding multi-phase clock outputs of the clock signal generator 51 and a start pulse input SP connected to a corresponding output of the generator 51.

The flip-flops 36 to 40 have non-inverting or direct outputs Q which form the outputs OUT1 to OUT5 of the shift register. Each flip-flop has a set input S connected to the output of the AND gate of that stage and a complementary or inverted (active low) reset input RB connected to the appropriate clock input. In particular, the inverted reset inputs of the flip-flops 36 and 39 of the first and fourth stages are connected to the first clock input CK1, the inverted reset inputs of the flip-flops 37 and 40 of the second and fifth stages are connected to the second clock input CK2, and the inverted reset input of the flip-flop 38 of the third stage is connected to the third clock input CK3. In general, for a shift register having Y clock inputs, each (nY+y)th stage shift register reset input is connected to the yth clock input, where O<y Y and n is a non-negative integer. In practice, a minimum of three multi-phase clock inputs is required for correct operation of the bi-directional shift register.

The inputs of the AND gate of each stage are connected to the, output of the OR gate of the stage and to the inverted reset input of the flip-flop of that stage. The inputs of the OR gate of each intermediate stage are connected to the outputs of the preceding and succeeding stages, respectively. In the first stage 31, the inputs of the OR gate 46 are connected to the output of the second stage 32 and to the start pulse input SP. Conversely, the inputs of the OR gate 50 of the final stage 35 are connected to the output of the preceding stage 34 and to the start pulse input SP.

Figure 6:
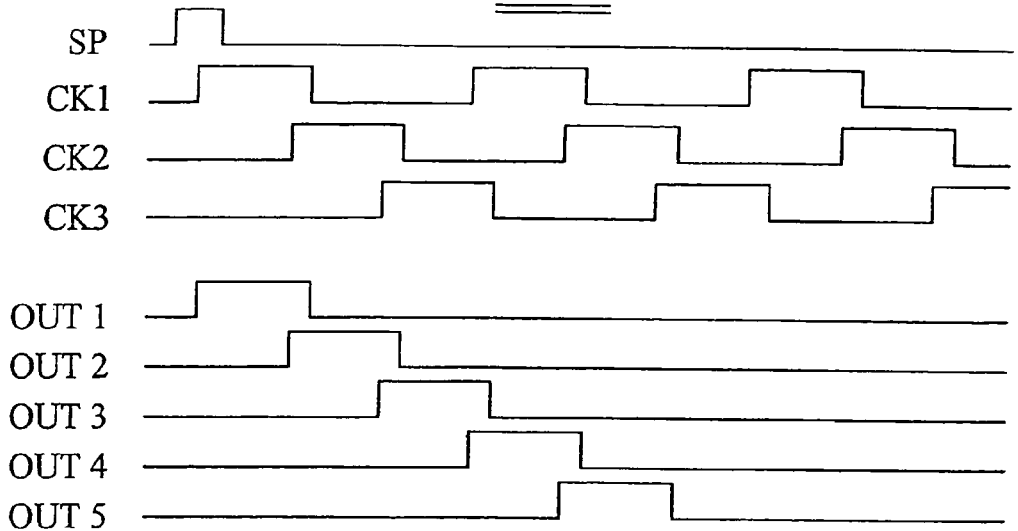
FIGS. 6 and 7 are timing diagrams illustrating waveforms occurring in the shift register of FIG. 5 for forward and reverse operations.
Figure 7:
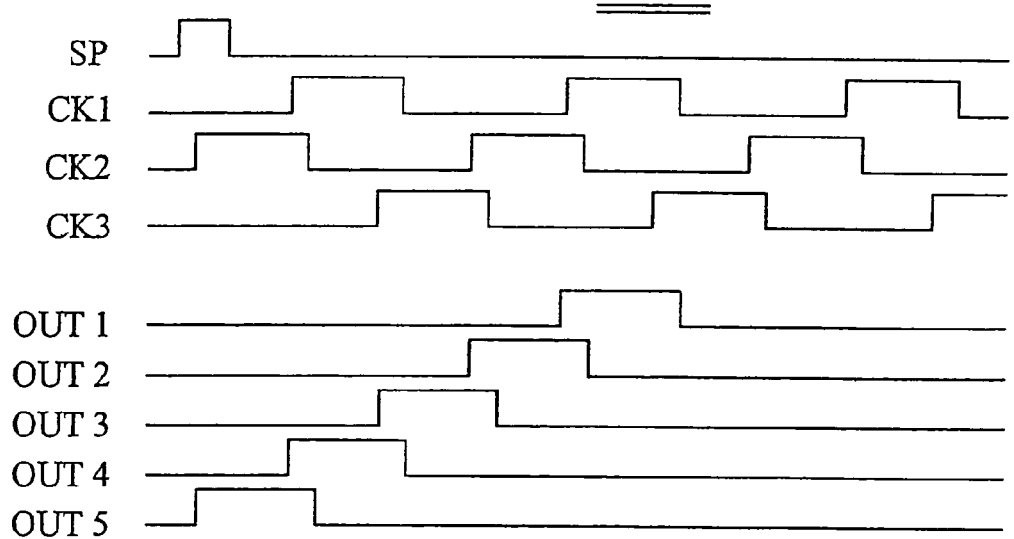

FIGS. 6 and 7 are timing diagrams illustrating waveforms occurring at various circuit nodes of the shift register of FIG. 5 for shifting in the forward and reverse directions, respectively. As shown in FIG. 6, a start pulse is supplied to the start pulse input SP and a first clock pulse, which overlaps with the start pulse, is supplied to the first clock input CK1. The flip-flop 36 of the first stage 31 is thus set to supply an output pulse at its output OUT1. The output high logic level signal is supplied to the OR gate 47 of the next stage 42 but this stage remains reset because of the low logic level of the second clock input CK2.

When the second clock input CK2 switches to the high logic level, resetting of the second flip-flop 37 is disabled and the flip-flop 37 is set via the OR gate 47 and the AND gate 42. Its output Q therefore rises. When the first clock input CK1 switches to the low logic level, the flip-flop 36 of the first stage 31 is reset and its output switches to the low logic level to mark the end of the output pulse of the first stage.

This operation is repeated so that effectively the start pulse is shifted from stage to stage in the shift register by each clock pulse with the corresponding output pulses overlapping as illustrated in FIG. 6. In particular, consecutive pairs of output pulses overlap with each other but non-consecutive pairs of output pulses do not overlap. The rising and falling edges of each output pulse are triggered by the rising and falling edges of a clock pulse.

FIG. 7 illustrates the signals occurring for operation of the shift register in the reverse direction. In this case, the first clock pulse which enters the start pulse in the flip-flop 40 of the fifth or last stage 35 is supplied to the second clock input CK2. The order of clock pulses is the reverse of that shown in FIG. 6 so that, in each intermediate stage, for the reverse shifting direction, each flip-flop is set by the adjacent higher ordered stage and reset by the adjacent lower ordered stage so that the start pulse is shifted progressively from the last stage 35 to the first stage 31 in synchronism with the clock pulses.

The overlap of the clock signals must be sufficient for each stage to be set before the previously set stage is reset. Also, the start pulse must overlap the active edge of the first clock pulse but must not overlap any subsequent clock pulse active edges.

Figure 8:
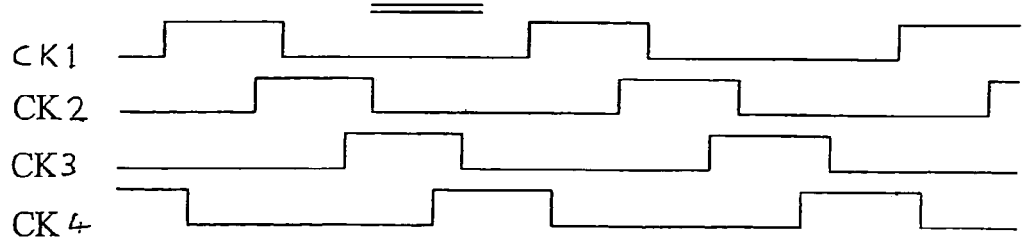
FIG. 8 is a timing diagram illustrating a four-phase clock for alternative embodiments of the invention.

The shift register requires a minimum of three clock inputs and three clock phases but more than three phases may be provided. FIG. 8 illustrates a four phase clock which may be used with a shift register in which the reset inputs of each fourth stage are connected to the same clock input with the first to fourth, fifth to eighth, ninth to twelfth, etc stages being connected to the clock inputs CK1 to CK4, respectively. Reversing the order of the clock phases and supplying the first clock pulse to the last stage causes shifting in the reverse direction as described hereinbefore.

Figure 9:
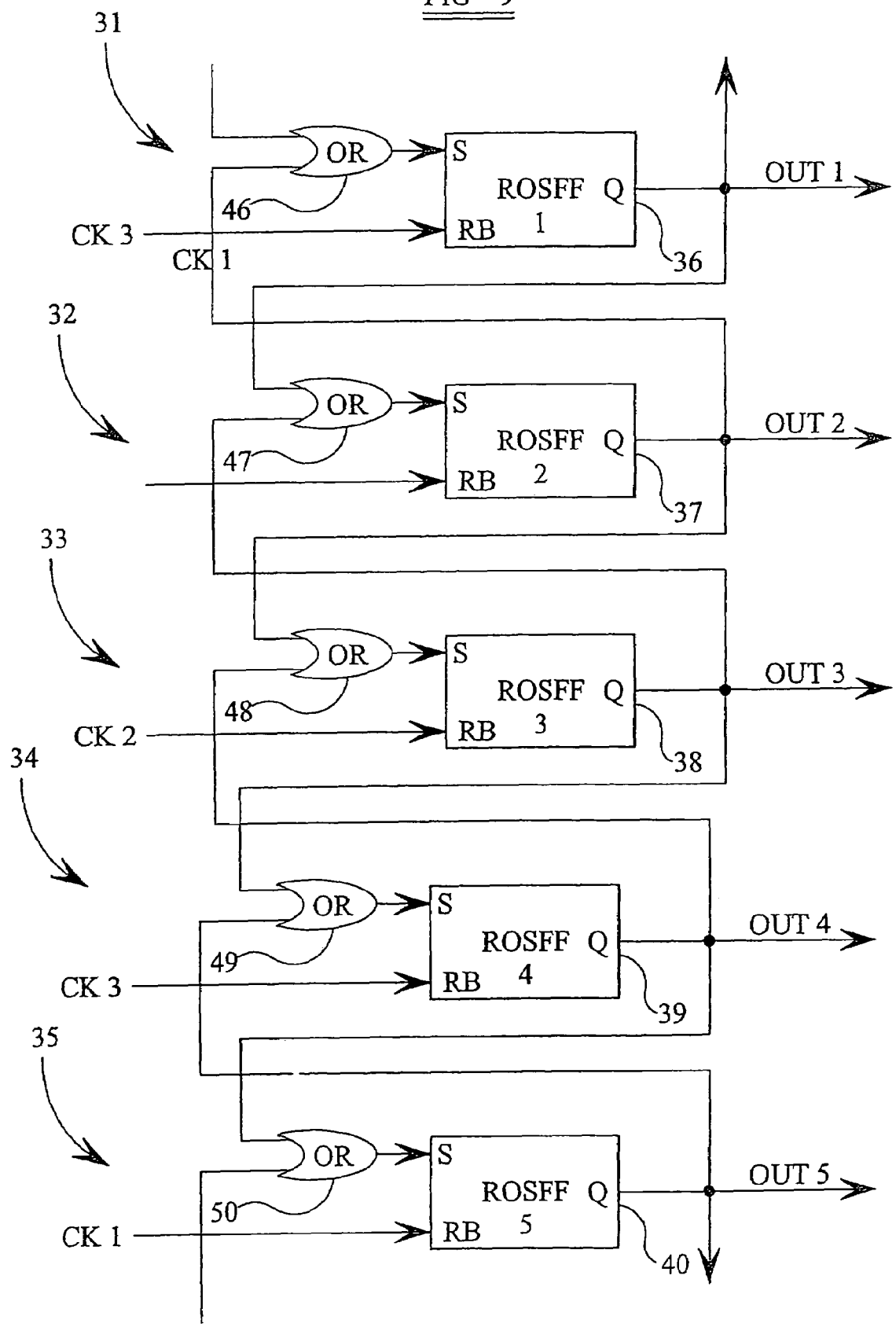
FIG. 9 is a block schematic diagram of a shift register constituting another embodiment of the invention.

The shift register shown in FIG. 9 differs from that shown in FIG. 5 in that each of the flip-flops 36 to 40 comprises a reset-over-set flip-flop so that the AND gates 41 to 45 are unnecessary and are omitted. A logic low level signal on each inverted reset input RB of the flip-flops 36 to 40 resets the stage and prevents it from being set. A high logic level signal on the set input S only sets the stage if it coincides with a high logic level on the reset input RB of the stage.

Figure 10:
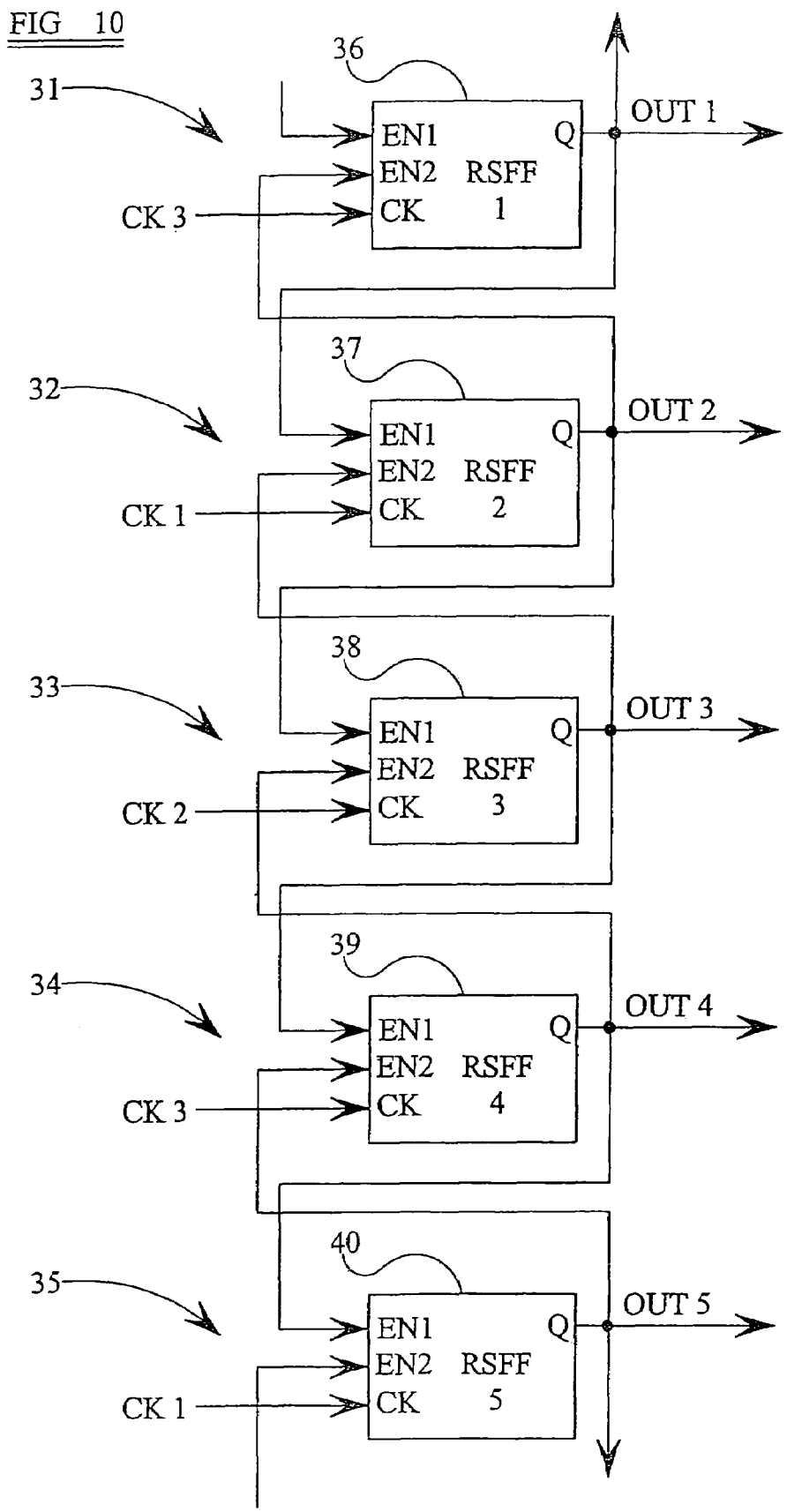
FIG. 10 is a block schematic diagram of a shift register constituting a further embodiment of the invention.
Figure 11:
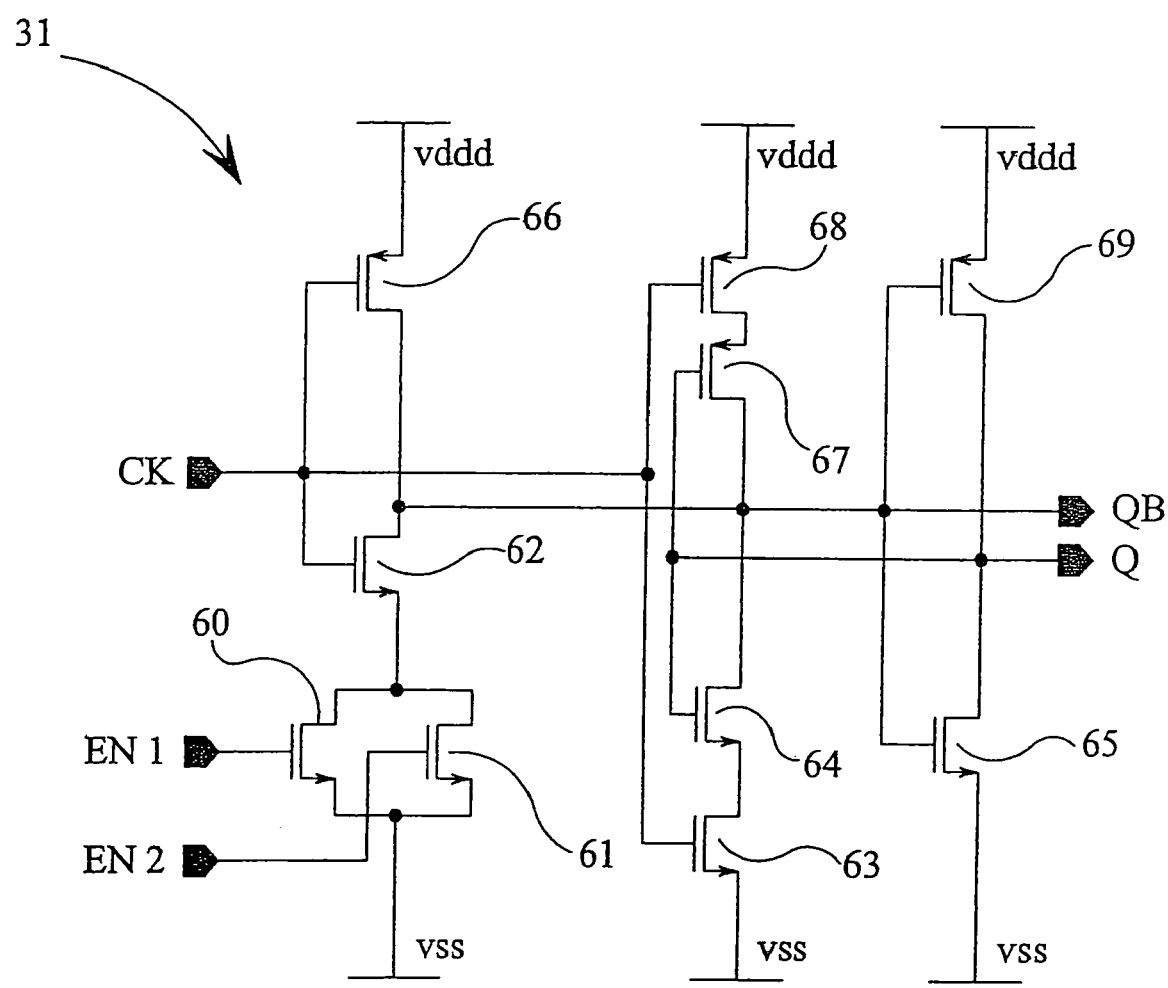
FIG. 11 is a circuit diagram of one of the stages of the shift register shown in FIG. 10.

FIG. 10 illustrates a shift register in which the functionality of the OR gates 46 is incorporated in the flip-flops by way of enable inputs EN1 and EN2. FIG. 11 illustrates a typical stage 31 of the shift register of FIG. 10 in more detail. The stage is embodied by complementary insulated gate metal oxide semiconductor thin film transistors comprising n-type transistors 60 to 65 and p-type transistors 66 to 69. The gates of the transistors 60 and 61 are connected to the enable inputs EN1 and EN2, respectively. The sources of the transistors 60 and 61 are connected to a negative supply line vss whereas the drains of these transistors are connected to the source of the transistor 62. The clock input CK is connected to the gates of the transistors 62, 66, 63 and 68. The drain of the transistor 66 is connected to the drain of the transistor 62 and the source of the transistor 66 is connected to a positive supply line vddd.

The drains of the transistors 62 and 66 are connected to the drains of the transistors 64 and 67, the gates of the transistors 65 and 69, and to the inverted output QB. The transistors 63, 64, 67 and 68 are connected in series between the supply lines vss and vddd. The transistors 64 and 67 operate as a complementary inverter.

The transistors 65 and 69 are arranged in series between the supply lines vss and vddd and operate as a complementary inverter. The drains of the transistors 65 and 69 are connected to the gates of the transistors 64 and 67 and to the direct output Q. The flip-flop is thus arranged as a cross-connected pair of inverters with an input gating arrangement.

Figure 12:
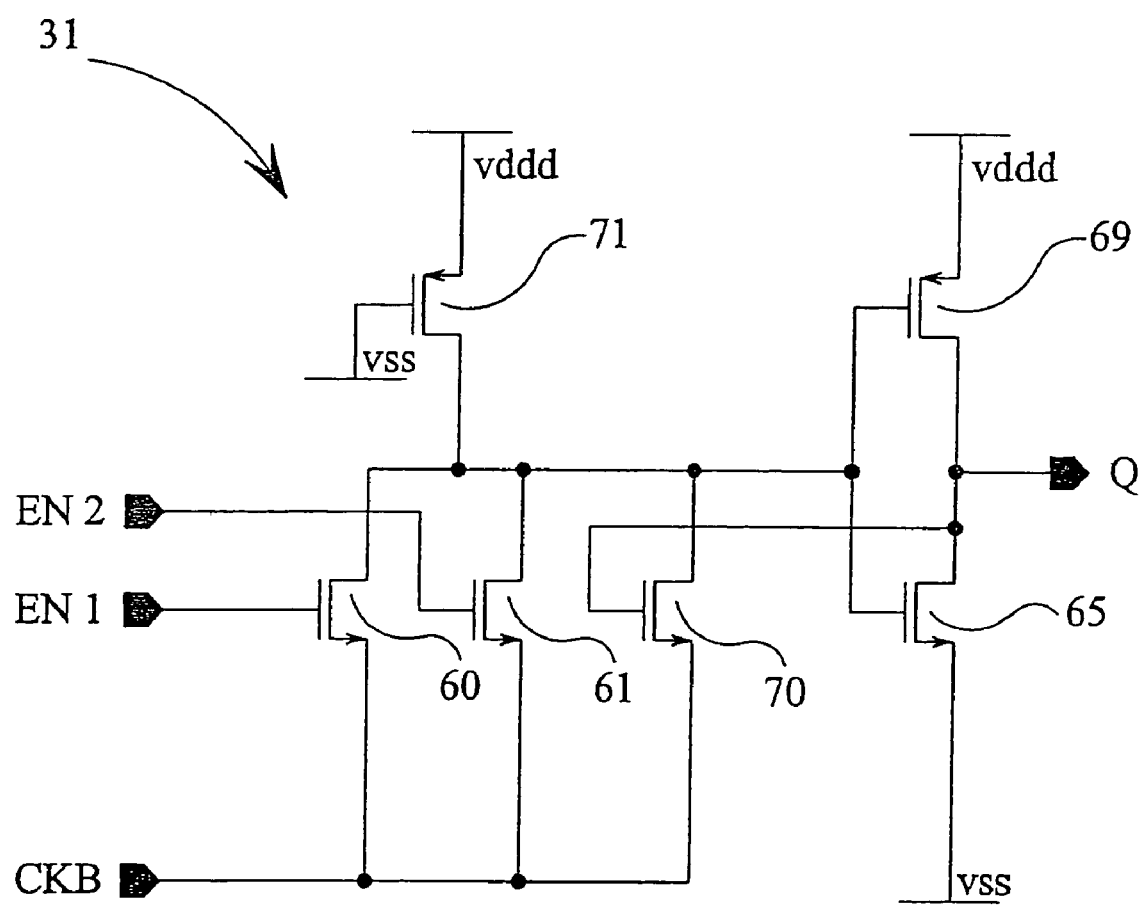
FIG. 12 is a circuit diagram of another type of stage which may be used in the shift register of FIG. 10.

FIG. 12 illustrates another example of a stage 31 which is suitable for use in the shift register shown in FIG. 10. This stage is suitable for use with low voltage active-low clock signals and includes a single-ended level shifter for the clock signals CKB.

The stage shown in FIG. 12 also comprises a complementary inverter formed by the transistors 65 and 69. Also, the enable inputs EN1 and EN2 are supplied to the gates of n-type transistors 60 and 61, respectively. The sources of the transistors 60 and 61 and of a further n-type transistor 70 are connected to the inverted clock input CKB whereas the drains of these transistors are connected to the gates of the transistors 65 and 69 and to the drain of a transistor 71, whose gate is connected to the negative supply line vss and whose source is connected to the positive supply line vddd. The gate of the transistor 70 is connected to the output Q.

When a logic high level is present on either of the enable inputs EN1 and EN2, the flip-flop is set by a logic low level at the clock input CKB and the output Q switches to the high logic level. This is maintained by the feedback from the output Q to the gate of the transistor 70 so that the state is maintained when the enable signals are absent. When the clock signal CKB switches to the high logic level, the flip-flop is reset. The output Q may be buffered before being fed back to the transistor 70 of the level shifter. Only one clock signal (and not its complement) is required and a high logic level clock signal ensures resetting of the flip-flop so that no asynchronous resetting arrangement is required.

Figure 13:
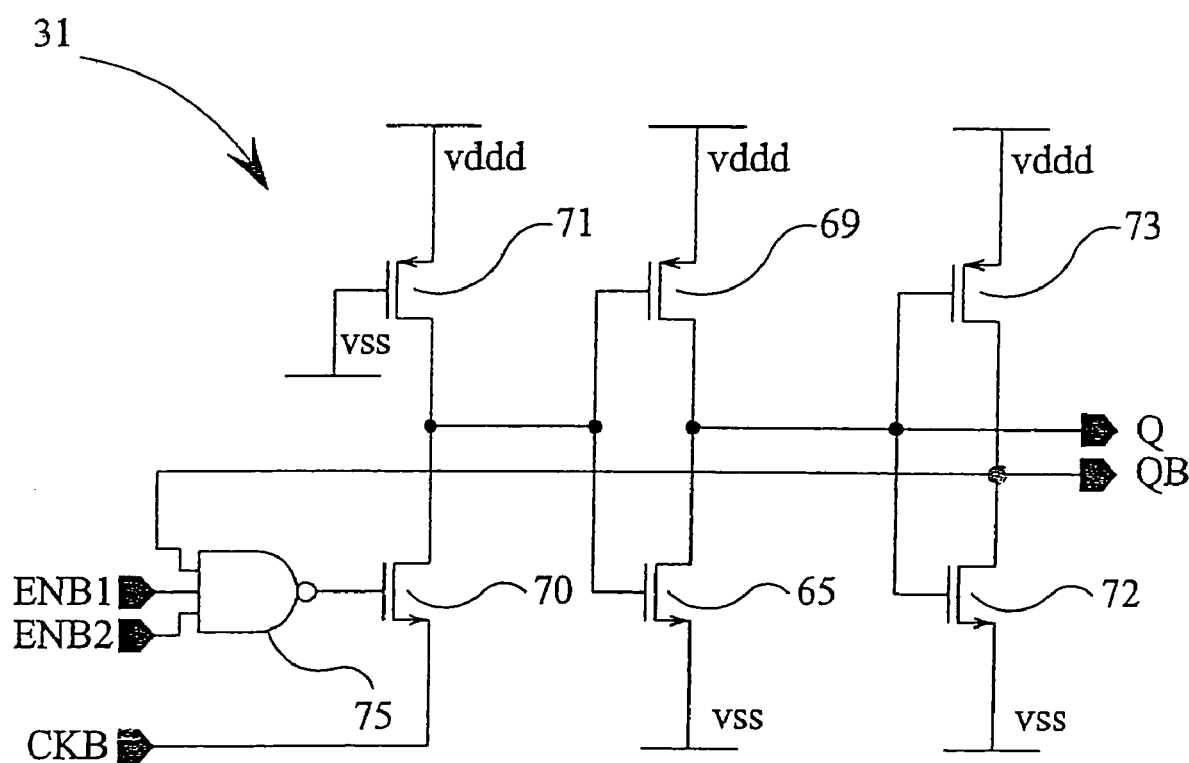
FIG. 13 is a circuit diagram of yet another type of stage which may be used in the shift register of FIG. 10.

FIG. 13 illustrates a stage 31 which functions in a similar way to the stage shown in FIG. 12 but with the addition of an output inverter comprising transistors 72 and 73 and with the enable inputs and feedback signal being supplied to a three input NAND gate 75, whose output is connected to the gate of the transistor 70. This arrangement has the advantage that the level shifter is better balanced. In particular, there is only one pull-down transistor 70 whereas, in the arrangement of FIG. 12, two pull-down transistors (70 and 61, or 70 and 60) could be operational at a time.

Figure 14:
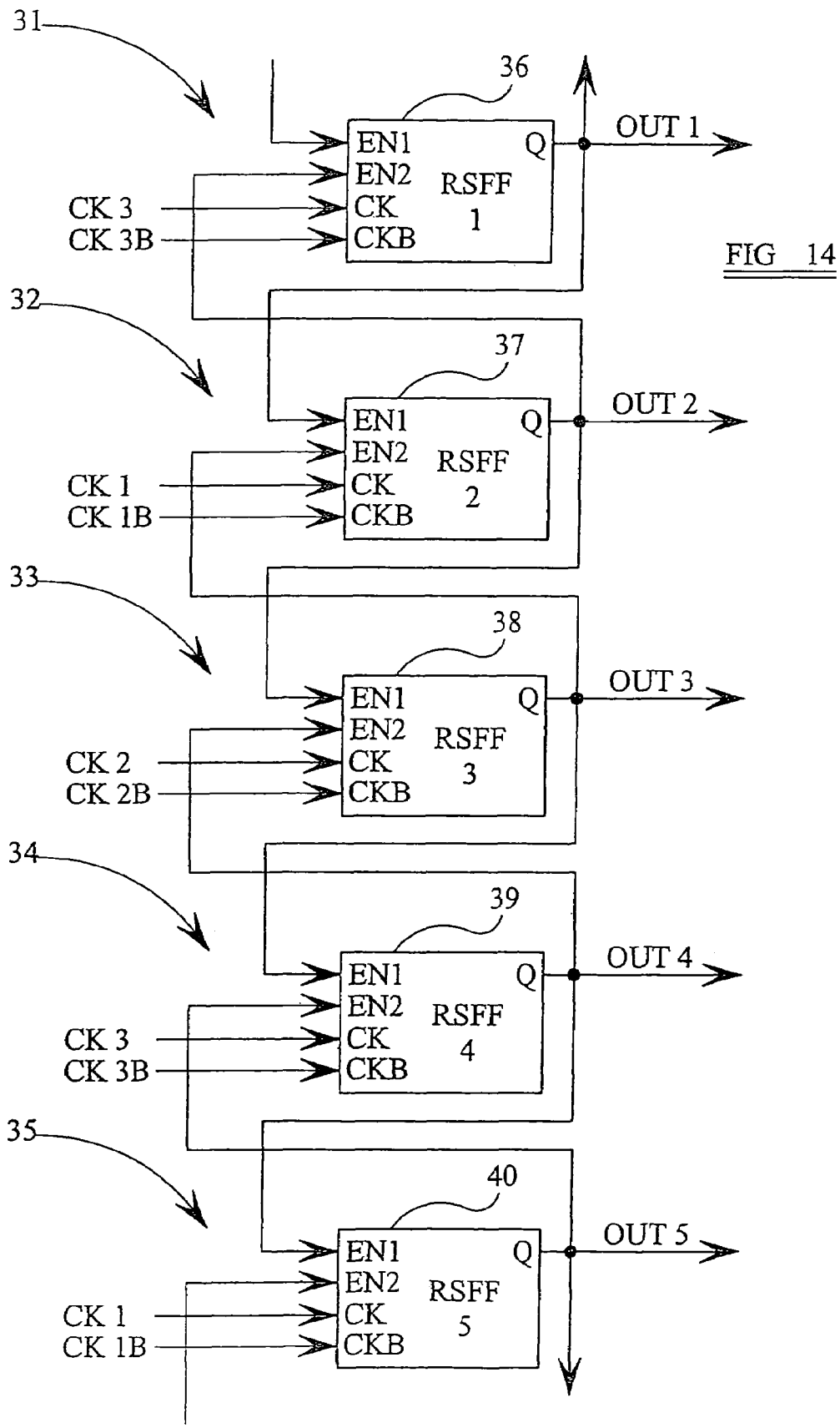
FIG. 14 is a block schematic diagram of a shift register constituting another embodiment of the invention.
Figure 15:
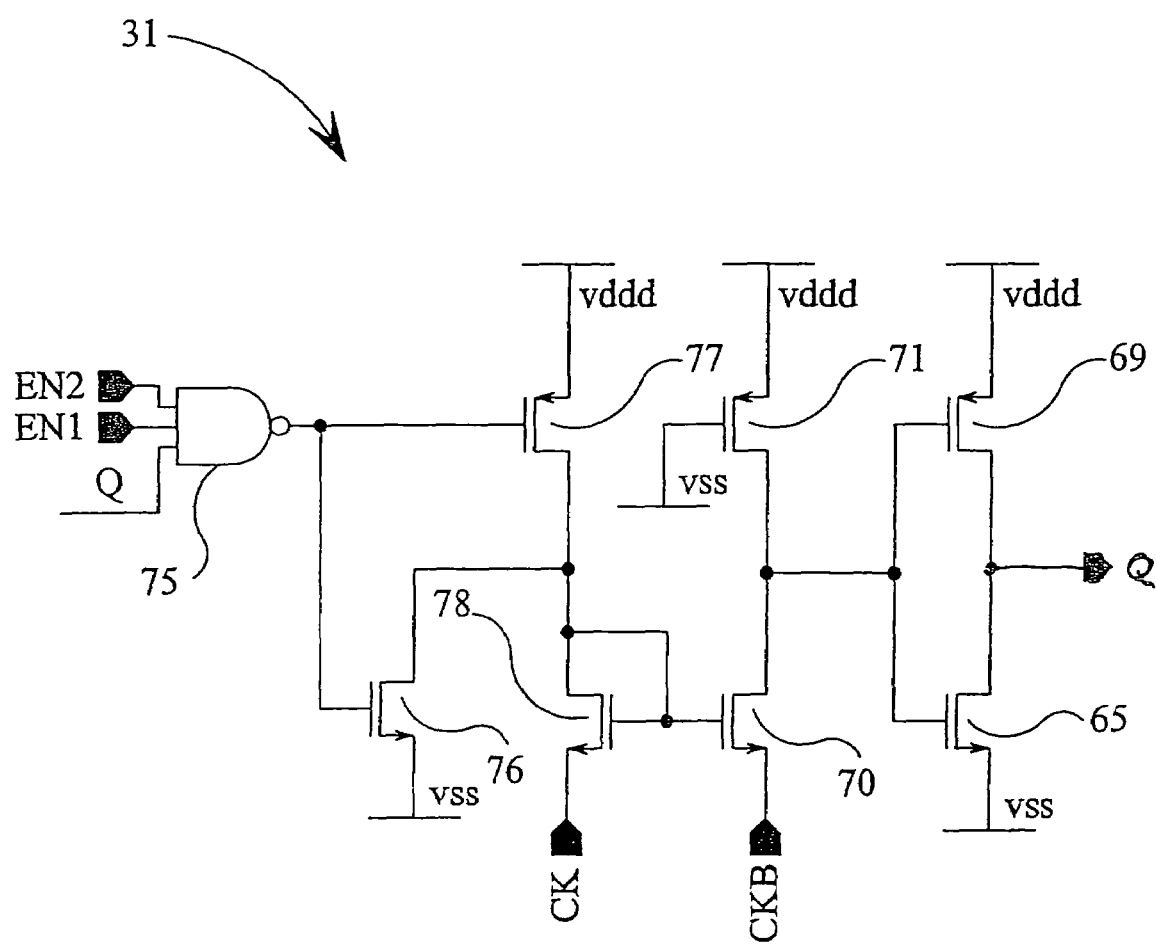
FIG. 15 is a circuit diagram of one of the stages of the shift register of FIG. 14.

FIG. 14 illustrates a shift register which differs from that shown in FIG. 10 in that the flip-flops 36 to 40 have complementary clock inputs CK and CKB connected to three phase complementary clock inputs CK1, CK1B; CK2, CK2B; CK3, CK3B. The stage shown in FIG. 15 differs from that shown in FIG. 13 in that the inverter 72, 73 is omitted and the level shifter is a double-ended level shifter comprising the transistors 70 and 71 and, in addition, transistors 76, 77 and 78. The output of the gate 75 is connected to the gates of the transistors 76 and 77, whose sources are connected to the negative supply line vss and the positive supply line vddd, respectively. The drains of the transistors 76, 77 and 78 are connected together and to the gates of the transistors 70 and 78. The source of transistor 78 is connected to the direct clock input CK. Such an arrangement has an advantage in that the level shifting operation is quicker and more robust to process variation than in the single-ended level shifter.

Figure 16:
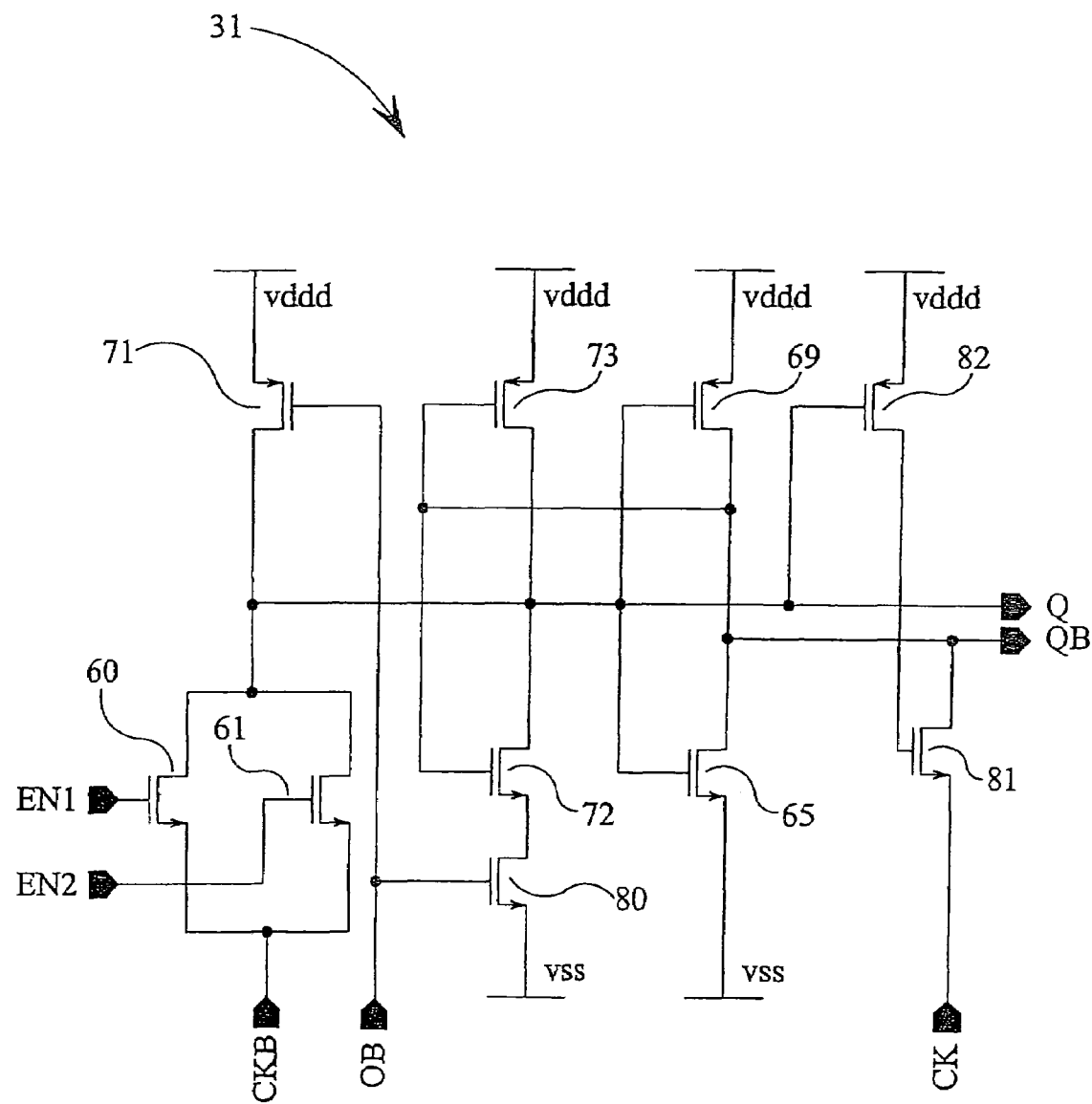
FIG. 16 is a circuit diagram of another type of stage which may be used in the shift register of FIG. 14.

The stage 31 shown in FIG. 16 includes two single-ended level shifters for use with low voltage complementary clock signals. Both set and reset functions are "active low" with a low logic level at the inverted clock input CKB setting the stage and a low logic level at the clock input CK resetting the stage if it is already set. An asynchronous reset OB is also required.

The asynchronous reset input OB is connected to the gate of the transistor 71 and to the gate of a transistor 80 whose source is connected to the negative supply line vss and whose drain is connected to the source of the transistor 72. The inverted output QB is connected to the gate of a transistor 82, whose source is connected to the positive supply line vddd and whose drain is connected to the gate of a transistor 81. The drain of the transistor 81 is connected to the direct output Q and the source is connected to the clock input CK. Cross-connected invertors are formed by the transistors 72, 73 and 65, 69 and a level shifting and OR arrangement is provided by the transistors 60 and 61, as described hereinbefore.

Figure 1:
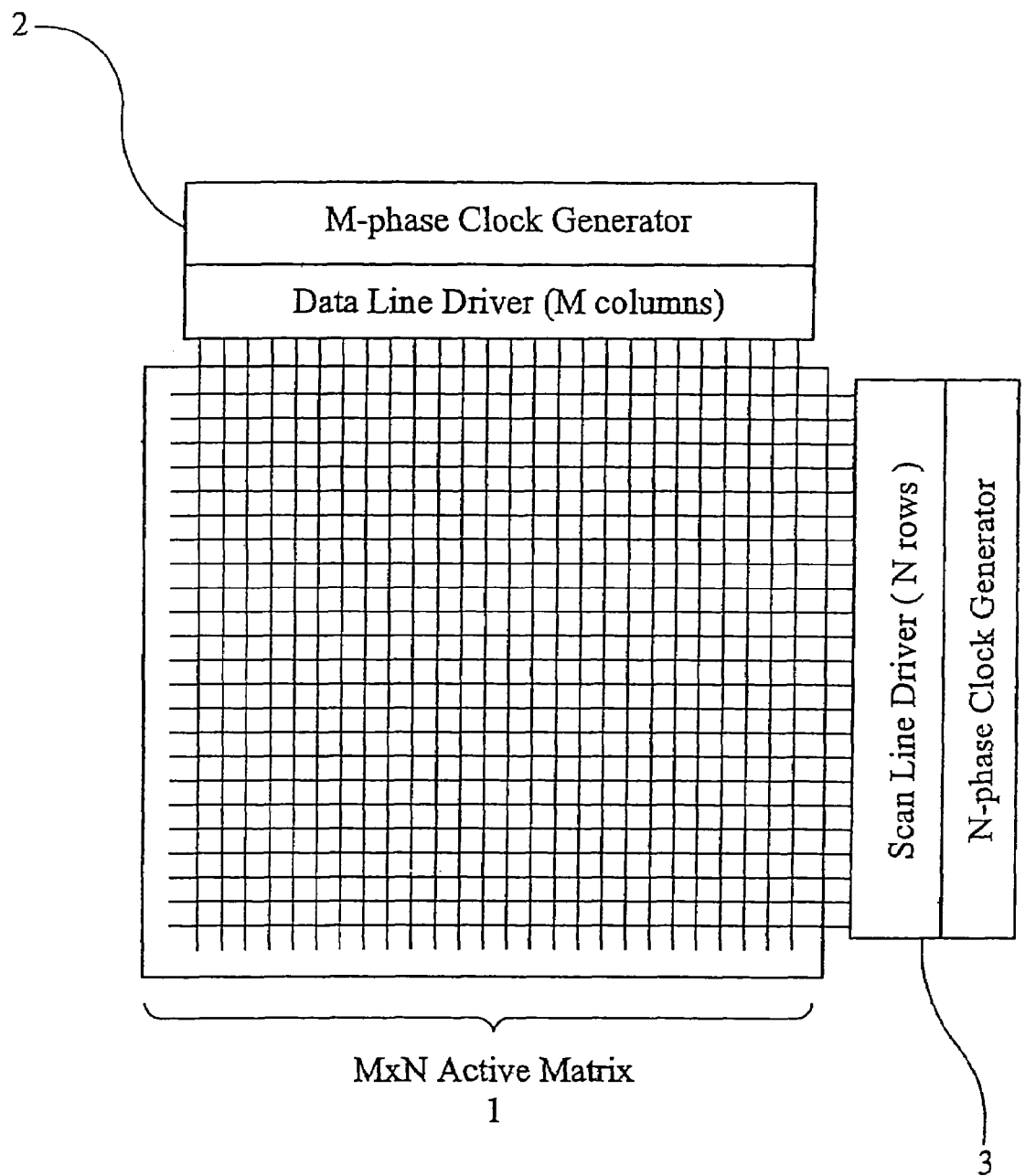
FIG. 1 is a block schematic diagram of an active matrix liquid crystal display.
Figure 4:
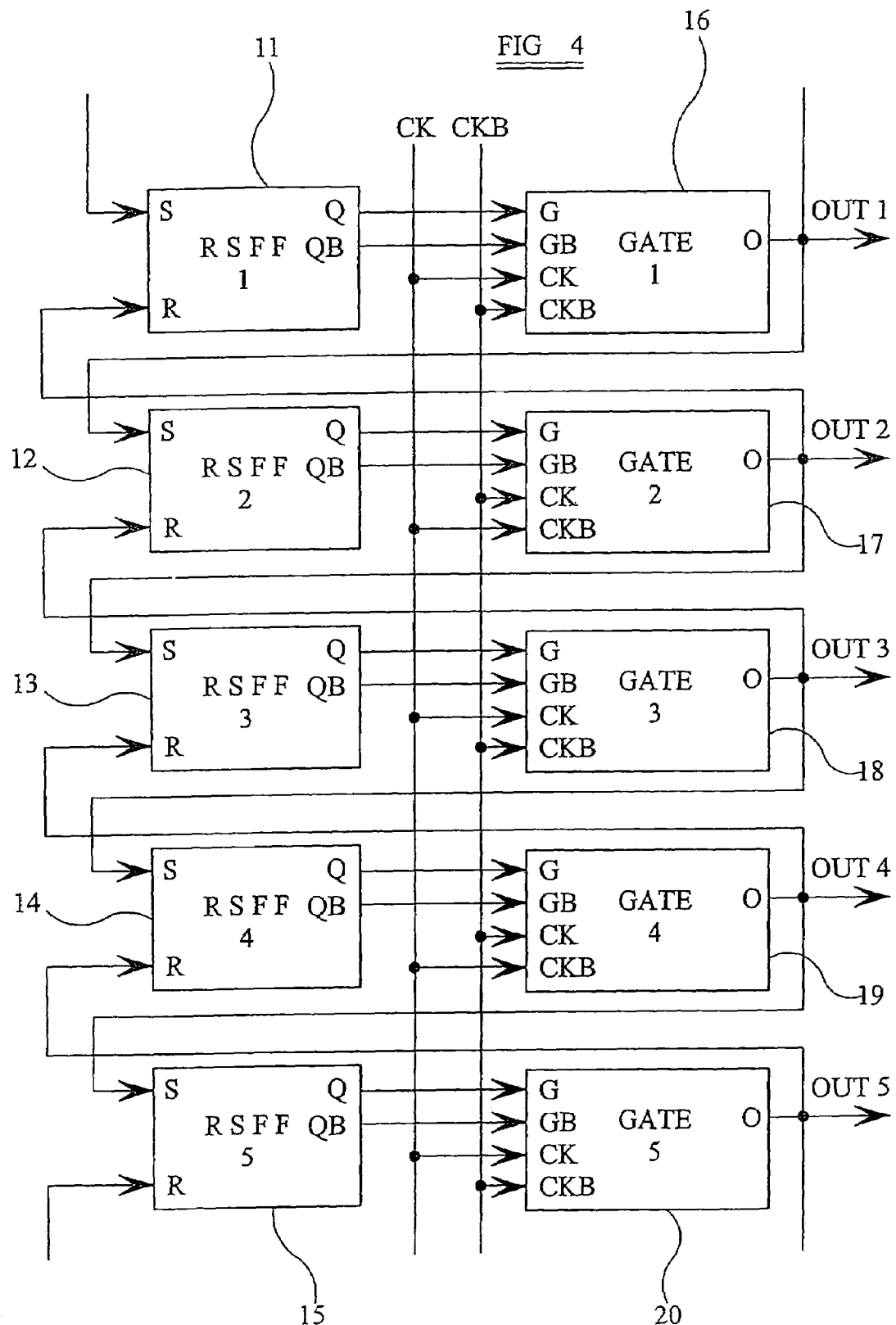
FIG. 4 is a block schematic diagram of a known type of shift register.

As described hereinbefore, the output pulses of the shift registers described hereinbefore overlap by approximately the same amount as the clock signals. Although this overlap may be exploited in the appropriate applications, it may be removed by the arrangement shown in FIG. 17 for other applications requiring non-overlapping multi-phase clock signals such as the scan line driver 3 shown in FIG. 1. This arrangement comprises a timing pulse generator 85 having an output PWC supplying pulses which act as pulse width control signals for determining the actual pulse widths of the individual phase outputs from the shift register. The output PWC is connected to first inputs of AND gates 86 to 90, whose second inputs are connected to the outputs of the flip-flops 36 to 40, respectively. The outputs of the gates 86 to 90 form outputs SL1 to SL5, respectively, and may be used to supply scan signals to an active matrix.

Figure 17:
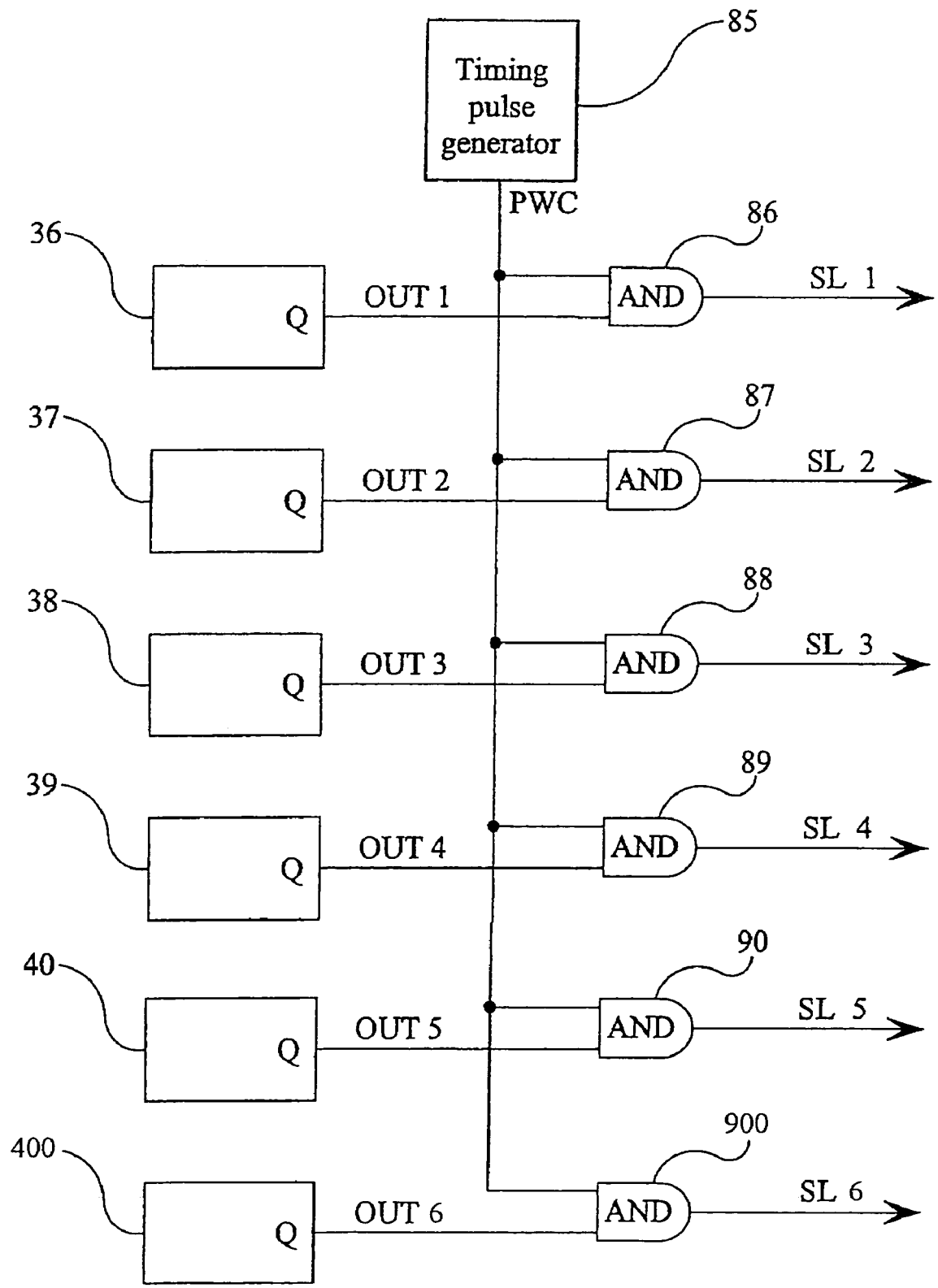
FIG. 17 is a simplified block schematic diagram of a shift register constituting another embodiment of the invention.
Figure 18:
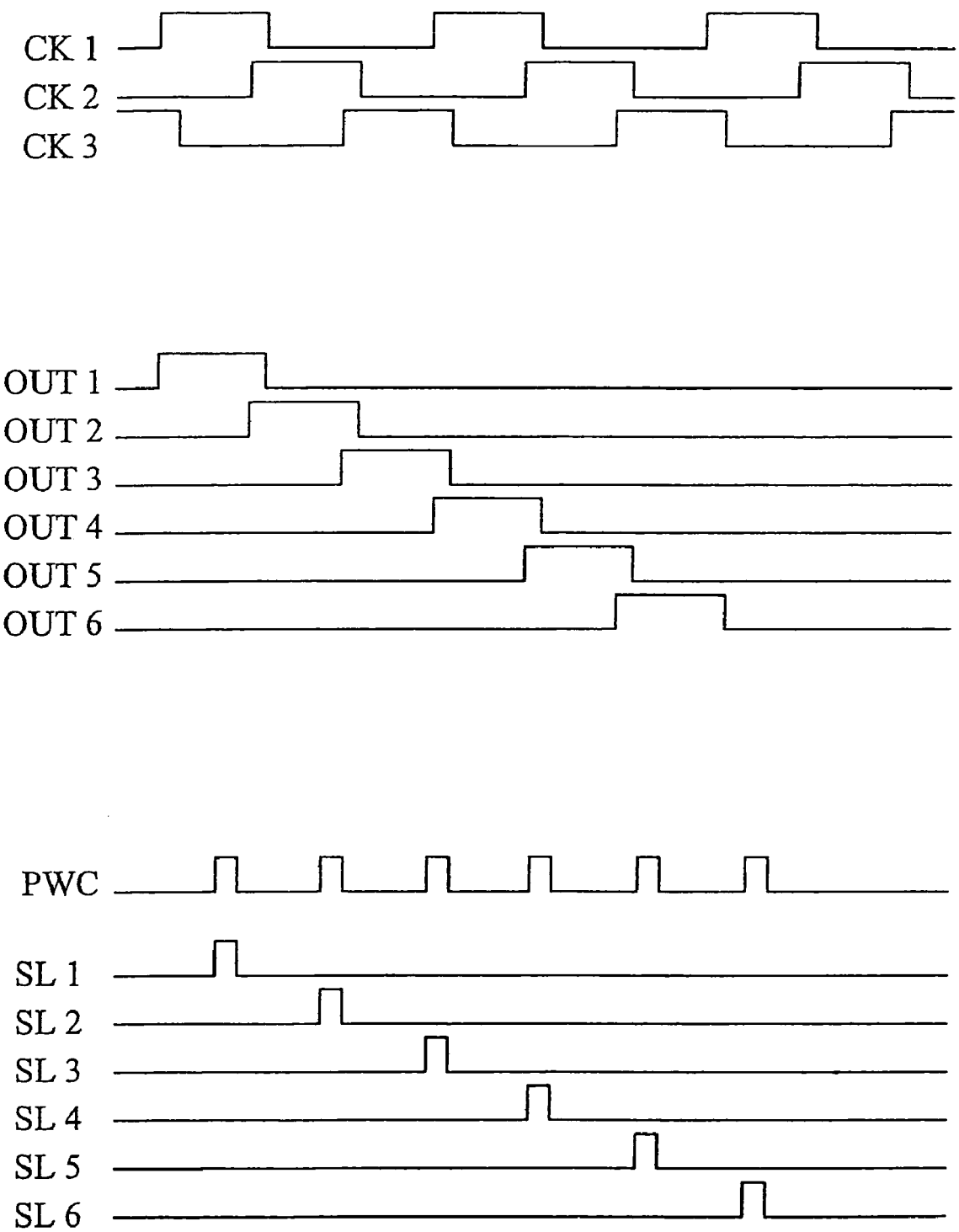
FIG. 18 is a timing diagram illustrating waveforms occurring in the shift register of FIG. 17.

A timing diagram illustrating the operation of the arrangement shown in FIG. 17 is given in FIG. 18. Each shift register output OUT1 to OUT6 is ANDed with the signal PWC to provide multi-phase non-overlapping scan signals SL1 to SL6, respectively. The duration of the scan signals can be varied by varying the pulse width of the signal PWC and the timing pulse generator 85 may be controllable or programmable to permit selection of the scan pulse widths.

Figure 19:
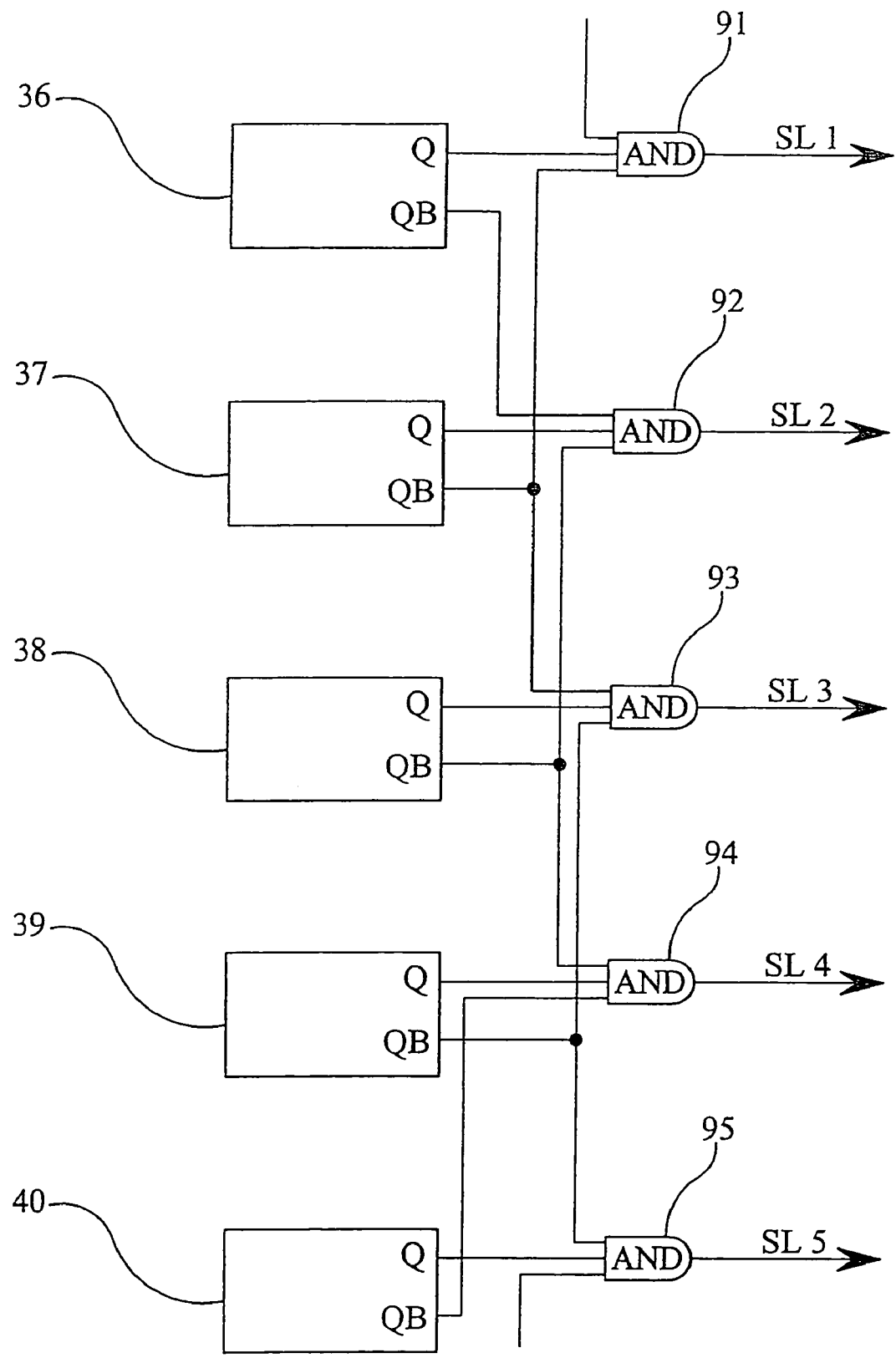
FIG. 19 is a simplified block diagram of a shift register constituting a further embodiment of the invention.

FIG. 19 illustrates in simplified form an alternative arrangement for removing overlaps in order to provide non-overlapping scan line signals SL1 to SL5 of a similar type to that shown in FIG. 18. In this case, the flip-flops 36 to 40 have direct and inverted outputs Q and QB and the direct output of each flip-flop is supplied to a first input of a respective AND gate 91 to 95, whose output supplies a respective scan line signal SL1 to SL5. Each gate 91 to 95 has second and third inputs connected to the QB outputs of the preceding and succeeding stages. This arrangement provides scan pulses which are non-overlapping and which have non-overlapping edges.

Figure 20:
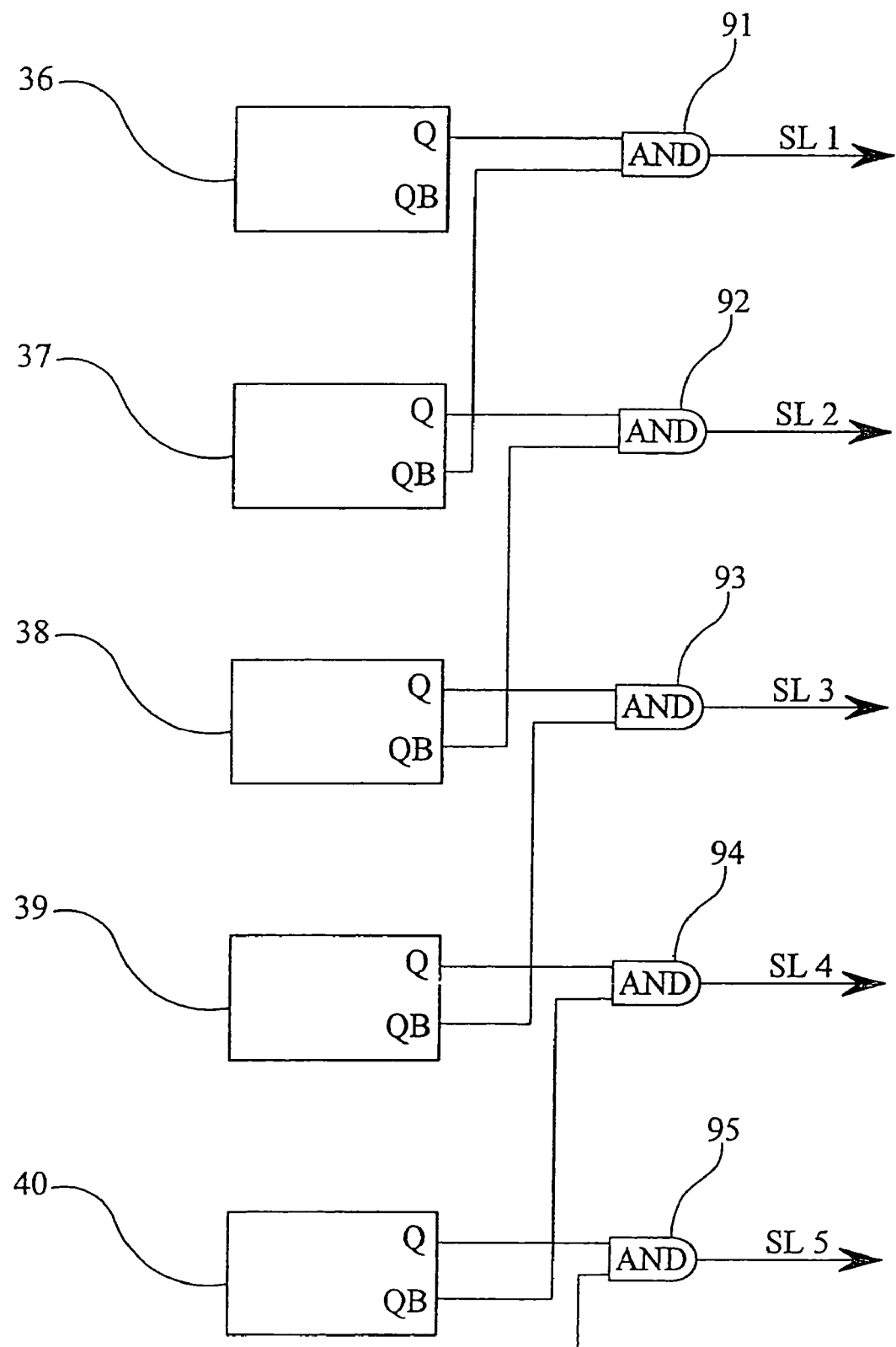
FIG. 20 is a block schematic diagram of a shift register constituting yet another embodiment of the invention.

FIG. 20 illustrates a modification to the arrangement shown in FIG. 19, in which each of the gates 91 to 95 has two inputs with the second input being connected to the inverted output QB of the flip-flop of the succeeding stage. Such an arrangement produces scan pulses which are substantially non-overlapping but which have coincident edges.

Figure 21:
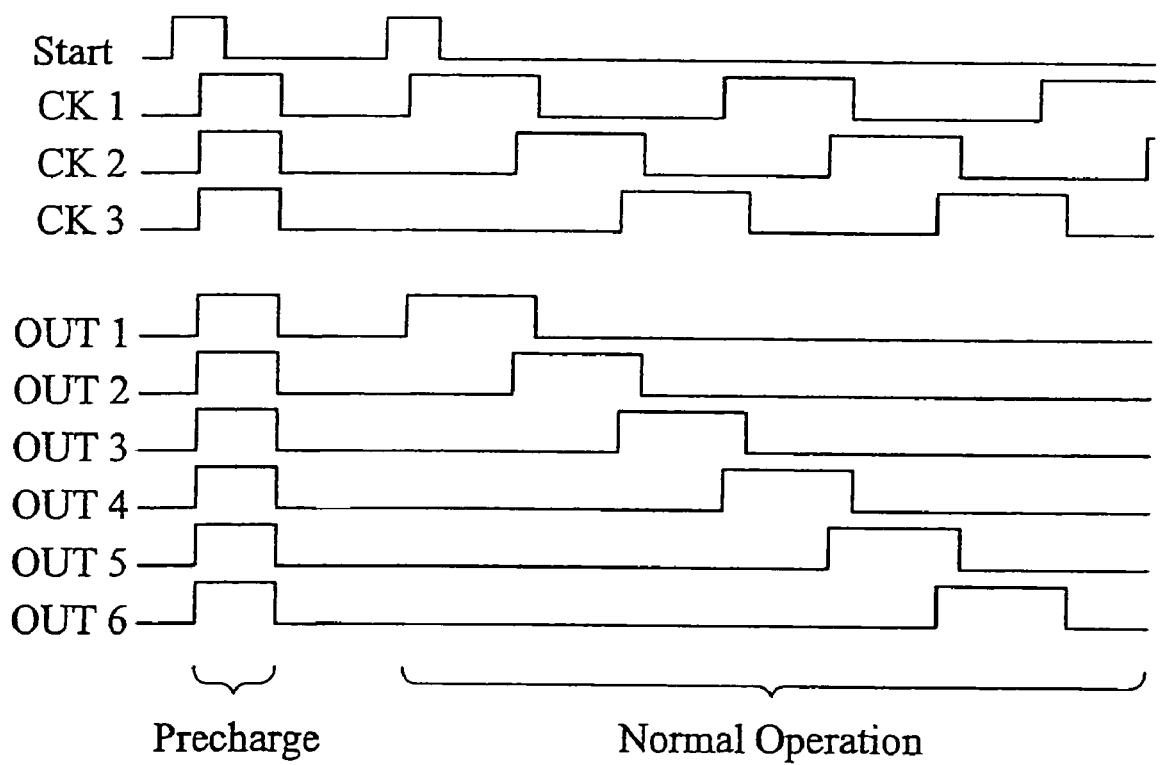
FIG. 21 is a timing diagram illustrating waveforms occurring in a shift register which does not require a separate asynchronous reset input and which provides data line precharging.

In many of the embodiments described hereinbefore, asynchronous resetting is unnecessary and the clock signal generator 51 can be arranged to supply a predetermined logic level to all of the clock inputs so as to reset all of the flip-flops 36 to 40. In particular, setting all of the clock inputs to the inactive state simultaneously may be used for resetting, for example prior to beginning a scanning cycle in a scan line driver or prior to beginning a row refresh cycle in a data line driver. Conversely, setting all of the clock inputs simultaneously to the active state at the same time as a start pulse may be used to set all of the stages as illustrated in FIG. 21. All of the stages may then be reset as described above. This may be used, for example, in a data line driver to precharge all of the data lines to an intermediate data value at the start of each new line or row refresh cycle. The clock signal generator 51 may be arranged to perform these functions automatically, selectively, or in accordance with programming.

The embodiments described hereinbefore producing overlapping pulses may be used to provide display drivers which are capable of providing a multi-resolution function. This may be achieved without requiring additional circuitry by altering the pulse widths of the clock pulses at the clock inputs supplied by the clock signal generator 51. This is illustrated in the upper part of FIG. 22.

In a high resolution mode of operation, the shift register is operated as described hereinbefore, for example, with reference to FIGS. 6 and 7, such that there is a relatively small overlap between the output signals of the shift register. The resolution may be reduced by supplying extended clock pulses CK1 to CK3 as shown in the upper part of FIG. 22 and, in this particular example, the shift register outputs are effectively activated in pairs. If both data and scan drivers are operated in this mode, then display resolution may be reduced to a quarter, for example to change from VGA to QVGA. In this case, the overlap between pairs of output pulses is extended such that, for example, there is a substantial overlap of the output pulses OUT1 and OUT2. When used in a data line driver, the data to be latched must be held constant across the falling edges of both output pulses OUT1 and OUT2 and must then change before the falling edges of the output signals OUT3 and OUT4. By adopting this timing, the items of data are latched onto pairs of data lines.

Figure 22:
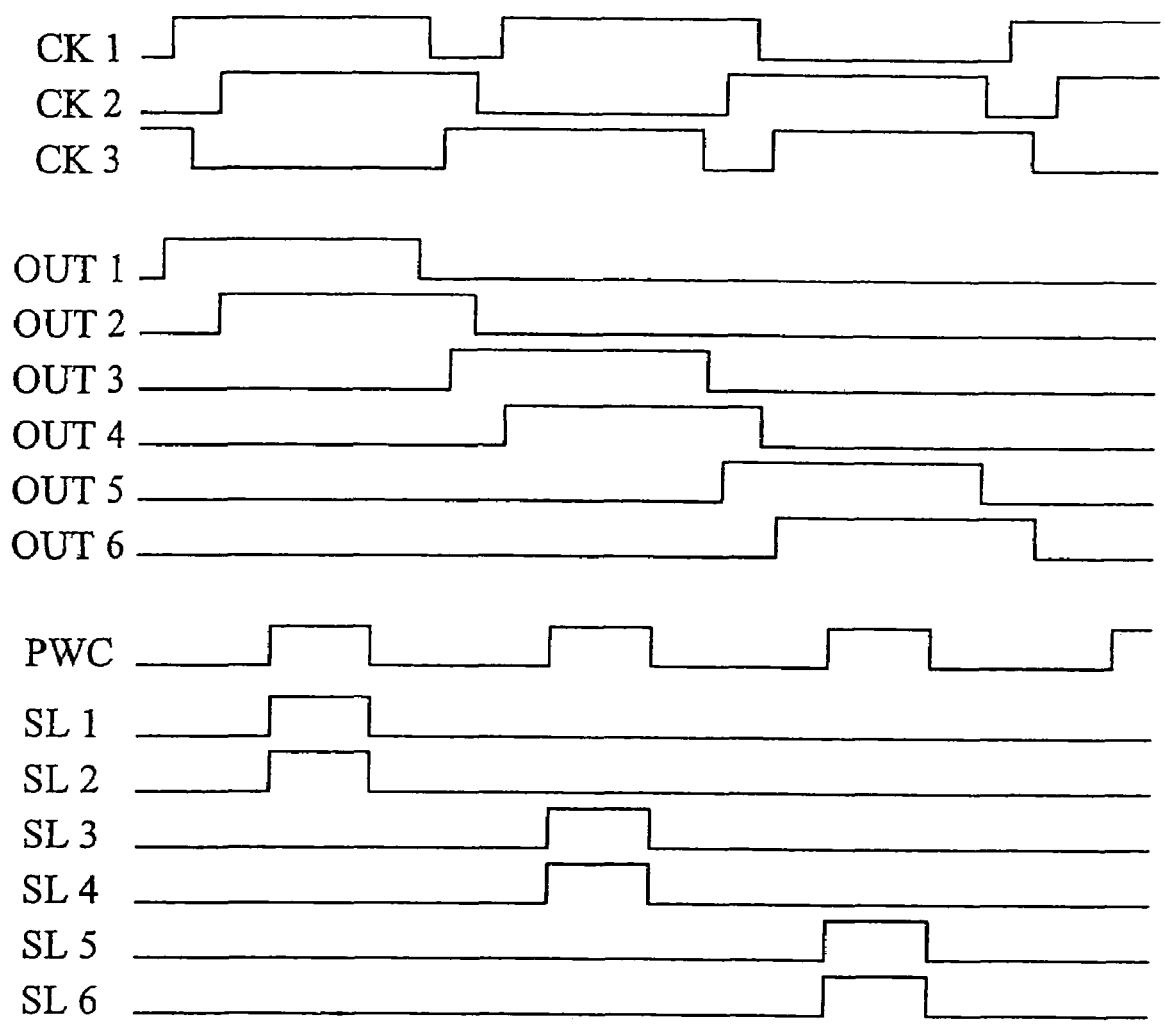
FIG. 22 is a timing diagram illustrating waveforms occurring in a shift register for use in multi-resolution displays.

The technique illustrated in FIG. 22 may be used with the arrangement illustrated in FIG. 17 such that the pairs of output pulses have the same timing and the falling edges of each pair occur before the rising edges of the next pair. The lower part of FIG. 22 illustrates how this may be achieved with the signals illustrated in the upper part and with the PWC signal from the timing pulse generator 85 having the illustrated waveform.

Figure 23:
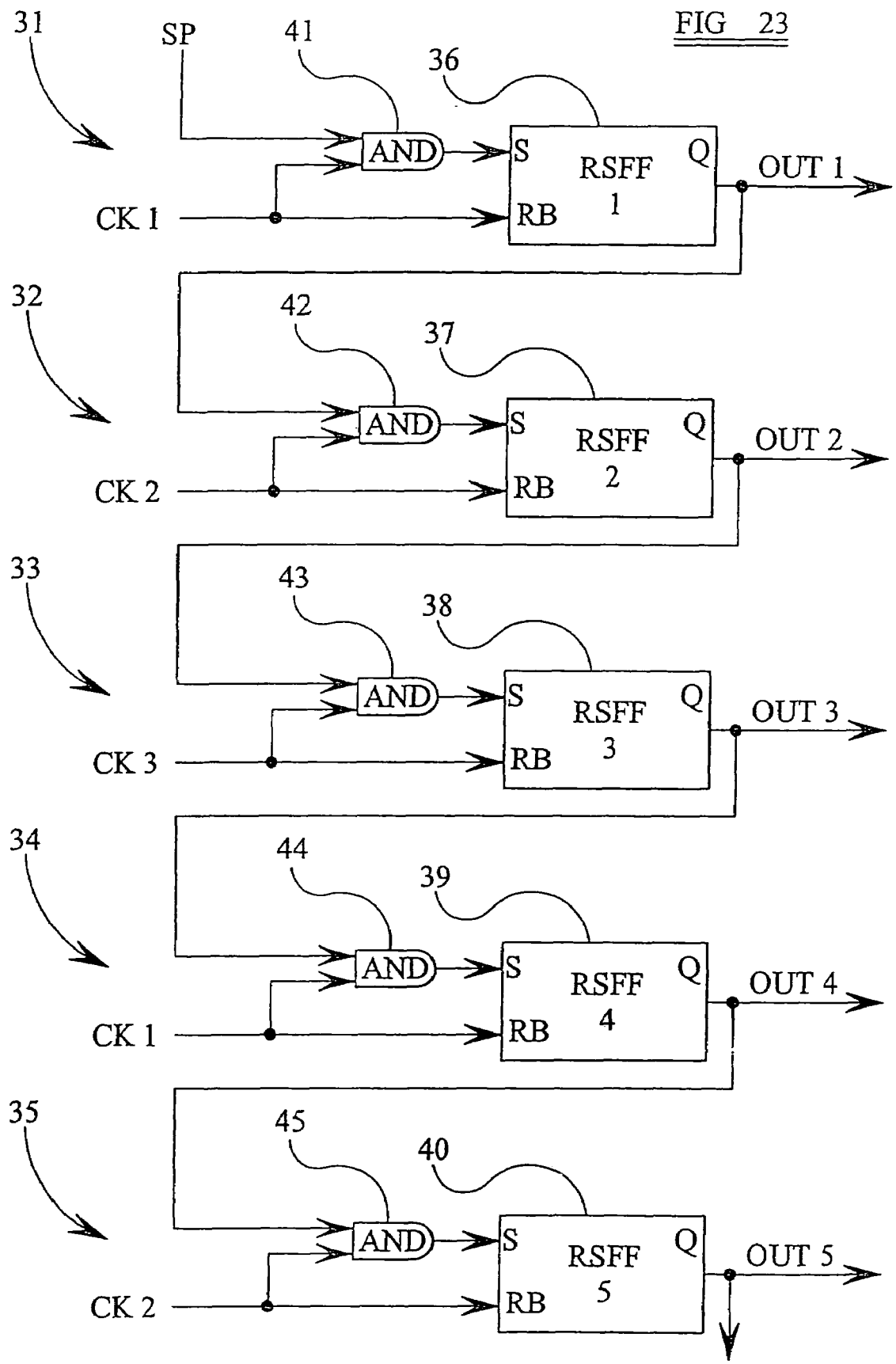
FIG. 23 is a block schematic diagram of a shift register constituting yet another embodiment of the invention.

The embodiments described hereinbefore are bi-directional and are capable of shifting a start pulse towards the first stage or towards the last stage of the shift register depending on the order of the clock pulses supplied by the generator 51. However, it is also possible to provide a uni-directional shift register and FIG. 23 shows an example of this. This shift register is of the same type as that shown in FIG. 5 but each stage 32 to 35 receives setting signals only from the preceding stage 31 to 34, respectively. Thus, the OR gates 46 to 50 are unnecessary and are omitted in the shift register of FIG. 23.

Operation of the shift register of FIG. 23 is the same as described hereinbefore for FIG. 5 in the "forward" direction with the waveforms illustrated in FIG. 6. Thus, the first clock pulse at the clock input CK1 clocks the start pulse SP1 into the flip-flop 36 of the first stage 31. The Q output of the flip-flop 36 is switched to the logic high level and this signal is supplied to a first input of the AND gate 42 of the second stage 32. However, the clock signal at the second clock input CK2 is at the logic low level so that the gate 42 is prevented from passing the logic high level to the set input S of the flip-flop 37 and holds the flip-flop 37 reset.

When the clock signal at the second clock input CK2 goes to the high logic level, the active low reset input RB of the flip-flop 37 no longer holds this flip-flop reset. Both inputs of the gate 42 are at the logic high level so that a logic high level signal is supplied to the active high set input S of the flip-flop 37, which is thus set and supplies a logic high level at its output Q. When the signal level at the first clock input CK1 goes to the logic low level, the first flip-flop 36 is reset and its output Q switches to the logic low level to mark the end of the output pulse at the output OUT1. This cycle of events is then repeated for each clock pulse so that the outputs OUT1 to OUT5 produce overlapping clock pulses in turn with the start pulse effectively being shifted towards the final stage of the shift register.

The other bi-directional embodiments described hereinbefore may be similarly modified to provide a uni-directional shift register.

Figure 24:
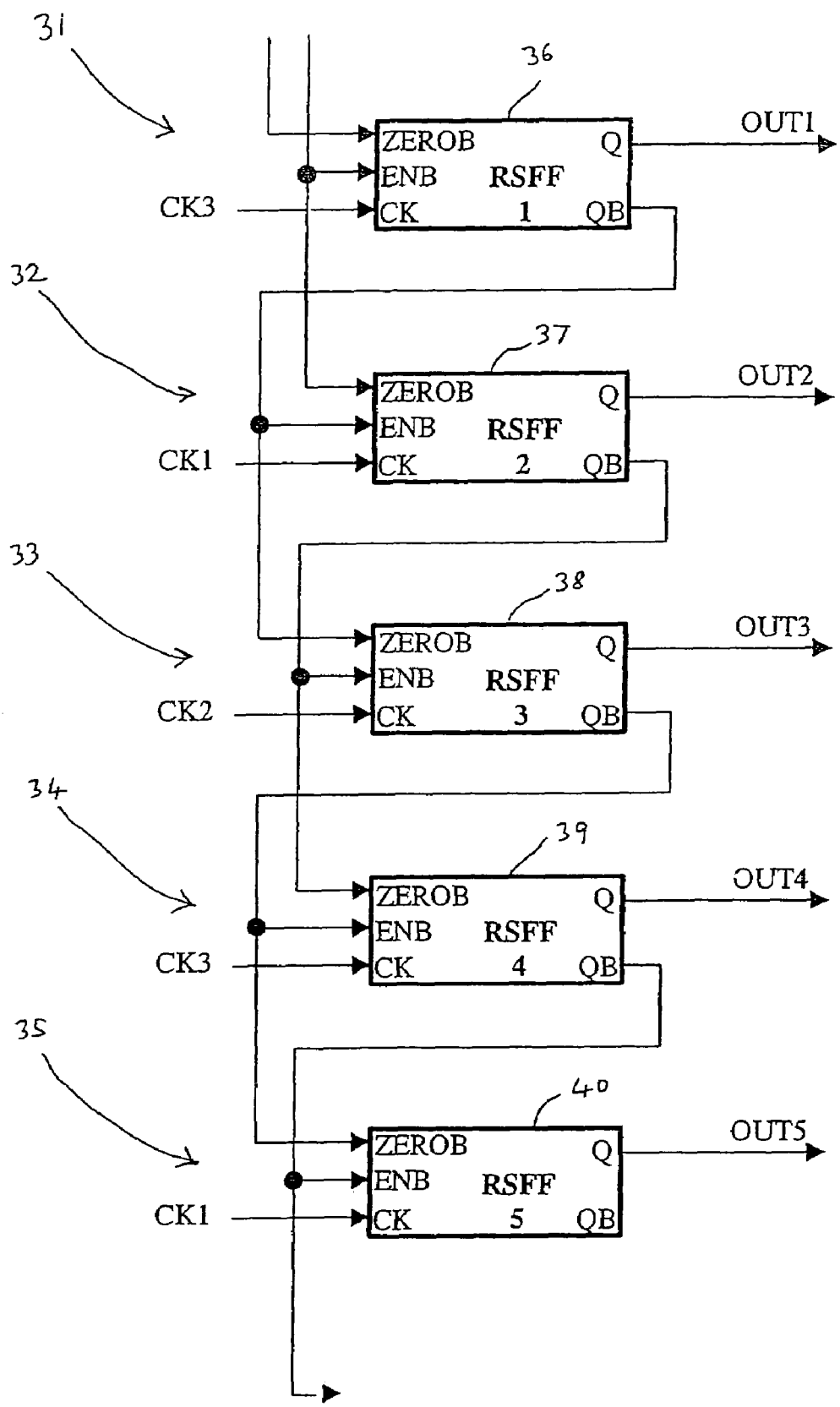
FIG. 24 is a block schematic diagram of a shift register constituting a further embodiment of the invention.
Figure 25:
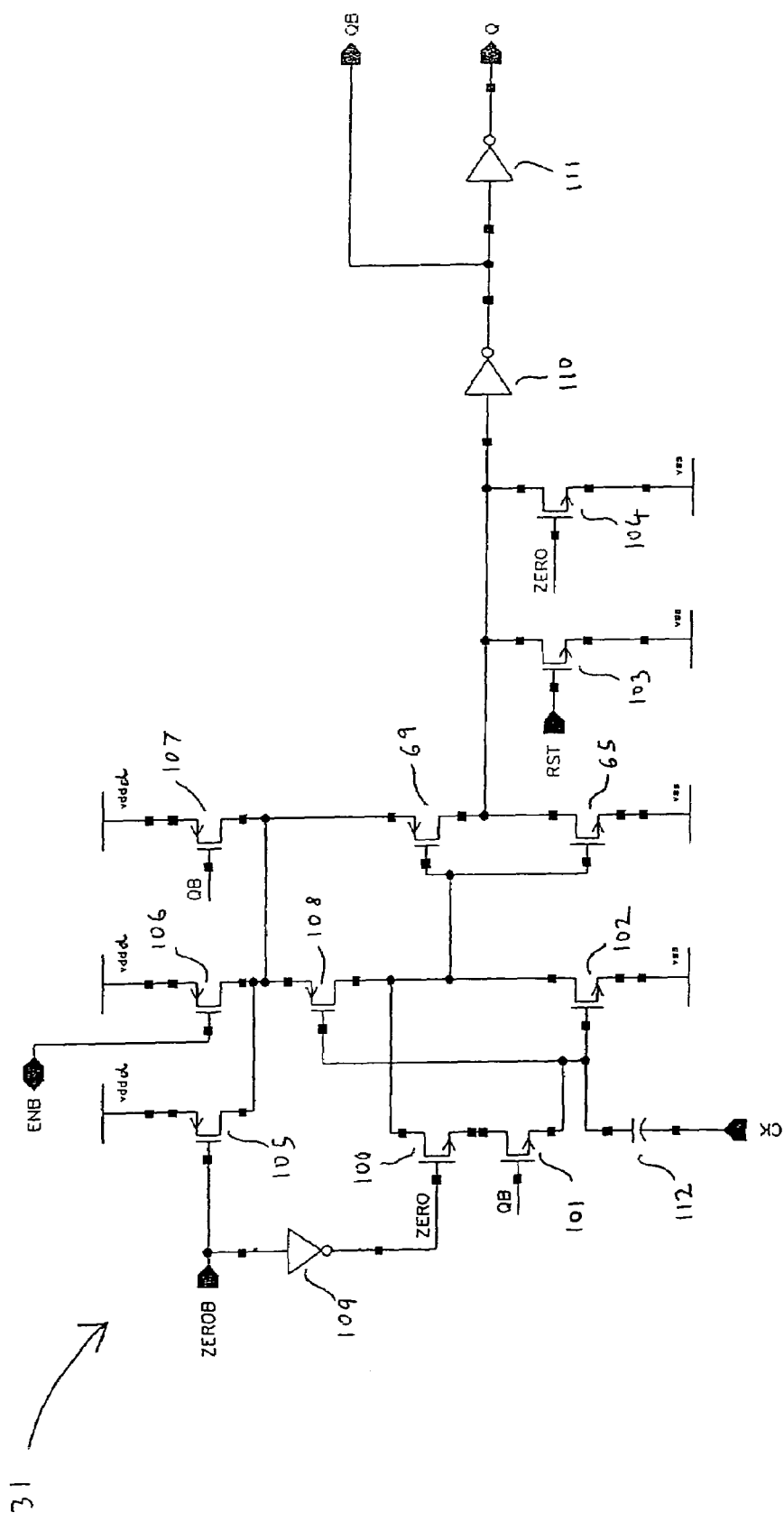
FIG. 25 is a circuit diagram of one of the stages of the shift register shown in FIG. 24.

FIG. 24 illustrates another uni-directional shift register which is capable of accepting low voltage clock signals and FIG. 25 illustrates one of the stages of the shift register in more detail. Each of the stages 36 to 40 has complementary outputs Q and QB, a clock input CK, and inverting input ENB and an inverting zeroing input ZEROB. Each enable input ENB is connected to the complementary output QB of the preceding stage. Each zeroing input ZEROB is connected to the complementary output of the stage before the preceding stage. Thus, each stage is zeroed when the stage before the preceding stage is set and is enabled when the preceding stage is enabled. FIG. 25 illustrates one of the stages, such as 31, in more detail. In addition to the complementary inverter formed by the transistors 65 and 69, the stage comprises n-type transistors 100 to 104, p-type transistors 105 to 108, inverters 109 to 111, and a capacitor 112. The transistors 105 to 107 are connected in parallel with their sources connected to the positive supply line vddd and their drains connected together and to the source of the transistor 108. The gates of the transistors 105 to 107 are connected to the zeroing input ZEROB, the enable input ENB, and the complementary output QB respectively. The zeroing input ZEROB is also connected to the input of the inverter 109, whose output is connected to the gates of the transistors 100 and 104. The gate of the transistor 101 is connected to the complementary output QB and the transistors 100 and 101 are connected in series between the gates and drains of the transistors 102 and 108. The gate of the transistor 102 is connected by the capacitor 112 to the clock input CK and the source of the transistor 102 is connected to the negative supply line VSS.

The drains of the transistors 102 and 108 are connected to the gates of the transistors 65 and 69 and the drains of the transistors 105 to 107 are connected to the source of the transistor 69. The drains of the transistors 65 and 69 are connected to the drains of the transistors 103 and 104 and to the cascade-connected inverters 110 and 111, which supply the complementary and direct outputs QB and Q, respectively. The sources of the transistors 103 and 104 are connected to the negative supply line VSS and the gate of the transistor 103 is connected to a reset input RST.

When the zeroing input ZEROB is active such that it is at the logic low level, the stage is zeroed while the clock input CK is also at the logic low level. The input and output of the inverter formed by the transistors 102 and 108 are connected together while power is supplied to the inverters formed by the transistors 65, 69 and 102, 108. The upper plate of the capacitor 112 stores the switch-point voltage of the inverter 102, 108.

When the previous stage is set, the stage is enabled by connecting the power supply to the inverter 102, 108 so that the input of the inverter returns to its switch-point voltage. When the clock signal at the input CK goes to the logic high level, charges injected across the capacitor 112 so as to raise the input voltage supplied to the inverter 102, 108 to cause its output to switch to the logic low level. The inverters 65, 69, 110 and 111 restore the level at the output of the inverter 102, 108 to a true logic value because, if the input of the inverter 102, 108 does not reach the positive supply voltage, the output of the inverter may still be above the negative supply voltage even when switched to its low state.

With the stage set, the transistor 107 maintains power to the inverters 102, 108 and 65, 69. The transistor 101 is switched off and injects charge into the input of the inverter 102, 108. When the clock signal subsequently falls to the logic low level, the charge injected thereby and the transistor 101 cause the input of the inverter to drop below its switch-point voltage so that the stage is reset.

The transistor 101 may be omitted. However, charge is also injected by the trailing edge of the zeroing pulse at the zeroing input ZEROB so that the input of the inverter 102, 108 may actually be slightly below its switch-point at the start of the enable phase. The presence of the transistor 101 provides a more rapid response to the falling edges of the clock signals at the expense of a slower rising edge.

Figure 26:
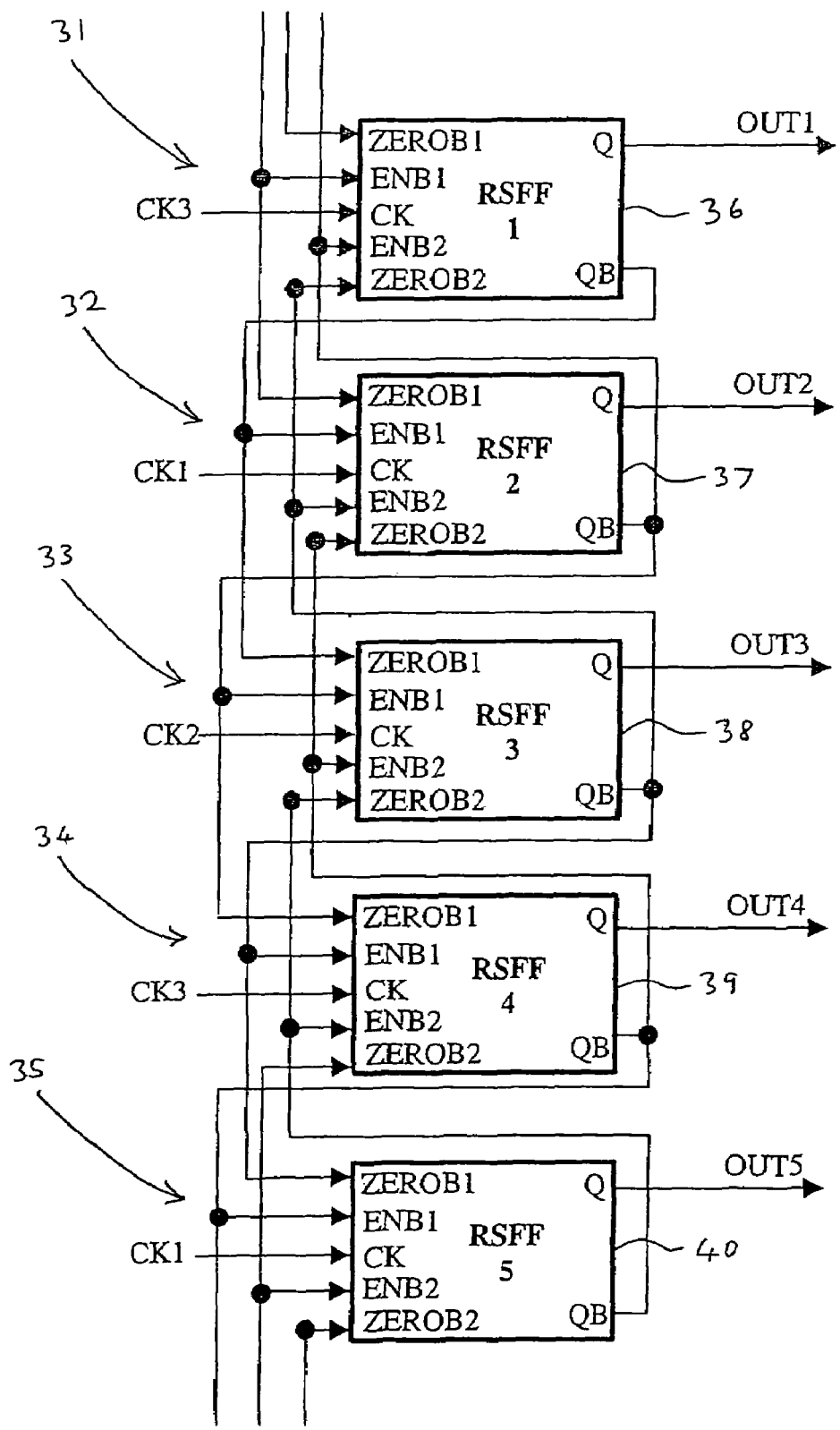
FIG. 26 is a block schematic diagram of a shift register constituting yet a further embodiment of the invention.

FIG. 26 illustrates a bi-directional version of the shift register illustrated in FIG. 24. Each nth stage is zeroed by the (n−2)th or (n+2)th stage and enabled by the (n−1)th or (n+1)th stage depending on the direction of shifting.

Figure 27:
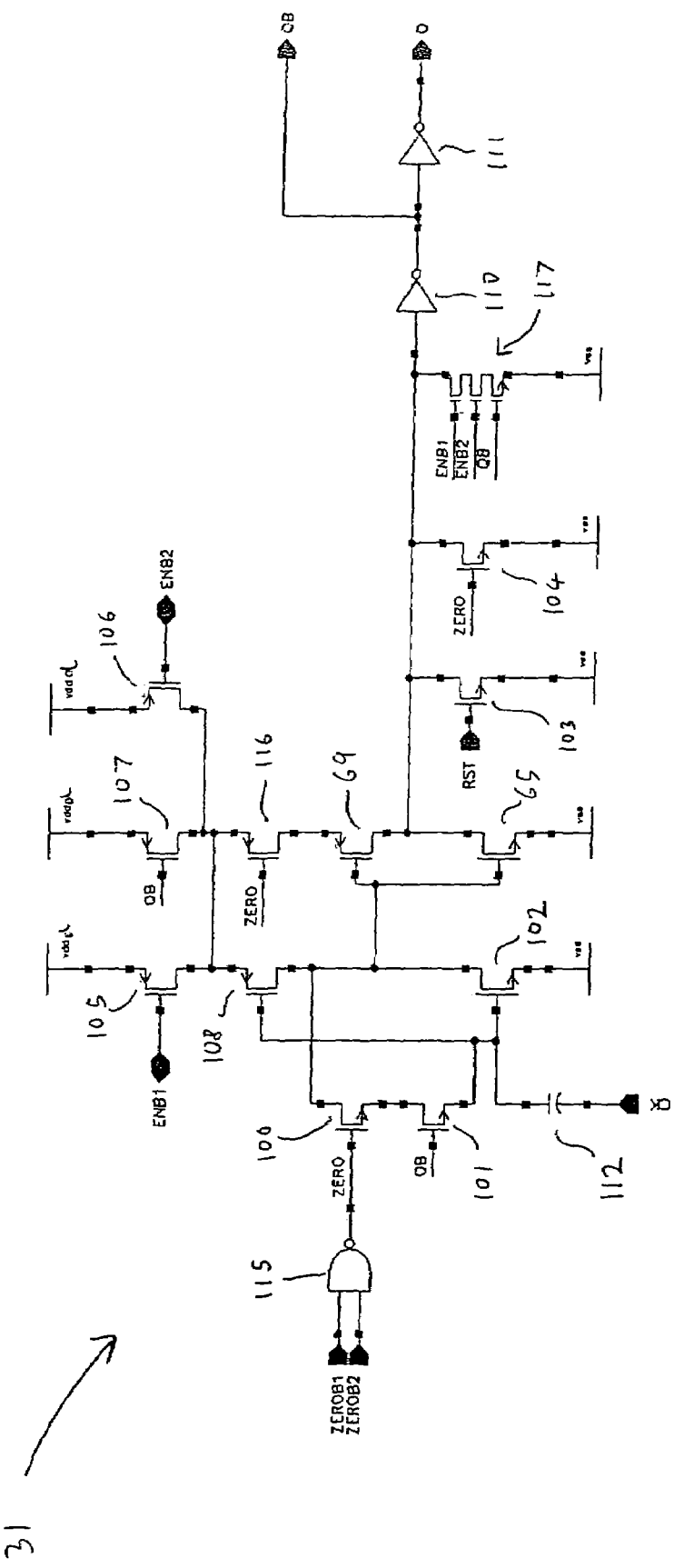
FIG. 27 is a circuit diagram of one of the stages of the shift register shown in FIG. 26.

One of the stages is illustrated in FIG. 27 and differs from that illustrated in FIG. 25 in that the inverter 109 is replaced by a NAND gate 115 whose inputs are connected to the zeroing inputs ZEROB1 and ZEROB2 and the gates of the transistors 105 and 106 are connected to the enable inputs ENB1 and ENB2. Also, a further transistor 116 is connected in series between the transistor 69 and the transistors 105 to 107 with its gate connected to the output of the NAND gate 115. Further, three series-connected transistors 117 are connected between the output of the inverter 65, 69 and the negative supply line with the gates of the transistors being connected to the enable inputs ENB1 and ENB2 and to the complementary output QB. Such arrangements have the advantage of occupying reduced substrate area compared with known types of uni-directional shift registers. Thus, where such a shift register is integrated on the display substrate of a display panel, the size of the panel surrounding the region of the panel displaying images can be reduced and this allows a smaller bezel size for the display panel. Alternatively or additionally, some or all of the saving in area may be used to integrate additional circuits which would otherwise require an increase in the panel area.

What is claimed is:

1. A shift register comprising X stages having outputs, where X is an integer greater than three, and Y clock inputs, where Y is an integer greater than two, each xth one of said stages, for each x such that $1<x\leq X$, comprising a flip-flop and logic circuit arranged to receive a set enable signal from said output of an (x−1)th one of said stages, each (nY+y)th one of said stages being arranged to be set in response to one of a leading edge and a first level of a clock signal at a yth one of said clock inputs in a presence of said set enable signal and to be reset in response to one of a trailing edge and a second level of said clock signal at said yth clock input for each y such that $O<y\leq Y$ and where n is a non-negative integer.

2. A register as claimed in claim 1, comprising a start pulse input and in which a first of said stages is arranged to receive a start pulse from said start pulse input.

3. A register as claimed in claim 1, in which each of said flip-flop and logic circuits comprises a reset-over-set flip-flop circuit.

4. A register as claimed in claim 3, in which said reset-over-set flip-flop circuit comprises: a reset-set flip-flop having a set input; and an AND gate having an output connected to said set input of said flip-flop, a first input connected to a yth one of said clock inputs and a second input connected to said output of said (x−1)th stage.

5. A register as claimed in claim 3, in which said reset-over-set flip-flop circuit has a complementary reset input connected to said yth clock input.

6. A register as claimed in claim 1, in which each of said stages comprises a level shifter for shifting a level of a reset signal.

7. A register as claimed in claim 1, comprising a clock signal generator having Y multiphase outputs connected to said Y clock inputs, respectively.

8. A register as claimed in claim 7, in which said clock signal generator is arranged to supply multiphase clock signals with said clock signals of pairs of adjacent ones of said phases overlapping each other.

9. A register as claimed in claim 8, in which said clock signals of non-adjacent ones of said phases are non-overlapping.

10. A register as claimed in claim 1, in which each said xth stage is arranged to receive a set enable signal from said (x+1)th one of said stages.

11. A register as claimed in claim 10, comprising a start pulse input and in which an Xth one of said stages is arranged to receive a start pulse from said start pulse input.

12. A register as claimed in claim 4, in which said reset-over-set flip-flop circuit comprises an OR gate having an output connected to said second input of said AND gate and inputs connected to said output of said (x−1)th stage and to an output of an (x+1)th one of said stages.

13. A register as claimed in claim 7, in which said clock signal generator is controllable to supply clock pulses in sequence to one of said $1^{st}$ to Yth clock inputs, respectively, and to said Yth to $1^{st}$ clock inputs, respectively.

14. A register as claimed in claim 7, in which said clock signal generator is controllable to supply inactive clock signals simultaneously to said clock inputs.

15. A register as claimed in claim 7, in which said clock signal generator is controllable to supply active clock signals simultaneously to said clock inputs.

16. A register as claimed in claim 1, comprising an arrangement for converting overlapping output pulses from said stages to non-overlapping pulses.

17. A register as claimed in claim 16, in which said arrangement comprises: a pulse generator for producing timing pulses, each of which has a rising edge after a rising edge of a respective one of said output signals of said stages and a falling edge before a falling edge of said respective output signal; and X logic circuits, each xth of which is arranged to perform a logical AND operation on said output signal of said xth stage and said timing pulses.

18. A register as claimed in claim 17, in which said rising edge of each said timing pulse occurs after a falling edge of one of said output signals preceding said respective output signal and said falling edge of each said timing pulse occurs before a rising edge of another of said output signals following said respective output signal.

19. A register as claimed in claim 16, in which each of said stages has direct and inverted outputs and said arrangement comprises a plurality of logic circuits, each xth of which is arranged to perform a logical AND operation on said direct output of said xth stage and said inverted outputs of said (x−1)th and an (x+1)th one of said stages.

20. A register as claimed in claim 16, in which each of said stages has direct and inverted outputs and said arrangement comprises a plurality of logic circuits, each xth of which is arranged to perform a logical AND operation on said direct output of said xth stage and said inverted output of one of said (x−1)th and an (x+1)th one of said stages.

21. A register as claimed in claim 1, comprising an arrangement for converting output pulses from the stages to groups of simultaneous pulses.

22. A register as claimed in claim 21, in which said arrangement comprises: a pulse generator for producing timing pulses, each of which overlaps with said output pulses of a respective group of said stages; and X logic circuits, each xth of which is arranged to perform a logical AND operation on said output pulse of said xth stage and said timing pulses.

23. A register as claimed in claim 22, in which a rising edge of each said timing pulse occurs after rising edges of all said output signals of said respective group and a falling edge of each said timing pulse occurs before falling edges of all of said output signals of said respective group.

24. A register as claimed in claim 1, in which Y is equal to three.

25. A register as claimed in claim 1, in which each of said clock inputs is a complementary clock input for receiving complementary clock signals.

26. A register as claimed in claim 1, comprising a CMOS integrated circuit.

27. A driver for an active matrix device, said driver comprising a shift register comprising X stages having outputs, where X is an integer greater than three, and Y clock inputs, where Y is an integer greater than two, each xth one of said stages, for each x such that $1<x\leq X$, comprising a flip-flop and logic circuit arranged to receive a set enable signal from said output of an (x−1)th one of said stages, each (nY+y)th one of said stages being arranged to be set in response to one of a leading edge and a first level of a clock signal at a yth one of said clock inputs in a presence of said set enable signal and to be reset in response to one of a trailing edge and a second level of said clock signal at said yth clock input for each y such that $0<y\leq Y$ and where n is a non-negative integer.

28. An active matrix device including at least one driver comprising a shift register comprising X stages having outputs, where X is an integer greater than three, and Y clock inputs, where Y is an integer greater than two, each xth one of said stages, for each x such that $1<x\leq X$, comprising a flip-flop and logic circuit arranged to receive a set enable signal from said output of an (x−1)th one of said stages, each (nY+y)th one of said stages being arranged to be set in response to one of a leading edge and a first level of a clock signal at a yth one of said clock inputs in a presence of said set enable signal and to be reset in response to one of a trailing edge and a second level of said clock signal at said yth clock input for each y such that $0<y\leq Y$ and where n is a non-negative integer.

29. A device as claimed in claim 26, comprising a liquid crystal display.

* * * * *